(12) United States Patent
Shimizu et al.

(10) Patent No.: US 10,028,393 B2
(45) Date of Patent: Jul. 17, 2018

(54) WIRING SUBSTRATE AND SEMICONDUCTOR PACKAGE

(71) Applicant: SHINKO ELECTRIC INDUSTRIES CO., LTD., Nagano (JP)

(72) Inventors: Noriyoshi Shimizu, Nagano (JP); Yusuke Gozu, Nagano (JP); Akio Rokugawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 14/790,131

(22) Filed: Jul. 2, 2015

(65) Prior Publication Data

US 2016/0007460 A1  Jan. 7, 2016

(30) Foreign Application Priority Data

Jul. 7, 2014  (JP) ................. 2014-139957

(51) Int. Cl.
*H05K 1/11* (2006.01)
*H05K 3/46* (2006.01)
(Continued)

(52) U.S. Cl.
CPC ...... *H05K 3/4644* (2013.01); *H01L 23/49811* (2013.01); *H01L 23/49822* (2013.01);
(Continued)

(58) Field of Classification Search
CPC .. H05K 3/4644; H05K 1/0206; H05K 1/0203; H05K 1/0306; H05K 1/095;
(Continued)

(56) References Cited

U.S. PATENT DOCUMENTS

| 7,371,974 B2 | 5/2008 | Toyoda et al. |
| 8,139,368 B2 * | 3/2012 | Nomura ............. H01L 23/3677 174/260 |

(Continued)

FOREIGN PATENT DOCUMENTS

| JP | 2001-185845 | 7/2001 |
| JP | 2002-344143 | 11/2002 |

(Continued)

OTHER PUBLICATIONS

Office Action dated Jan. 23, 2018 issued with respect to the basic Japanese Patent Application No. 2014-139957 with partial translation.

*Primary Examiner* — Ishwarbhai B Patel
*Assistant Examiner* — Paresh Paghadal
(74) *Attorney, Agent, or Firm* — IPUSA, PLLC

(57) ABSTRACT

A wiring substrate includes a core layer, a first wiring layer, a first insulating layer, a first via wiring, a second wiring layer, a second insulating layer, a second via wiring, a third wiring layer, a third insulating layer, a third via wiring, and a through-wiring. The through-wiring includes upper and lower end surfaces. The upper end surface has an area that is smaller than an area of the lower end surface. The upper surface of the first insulating layer is more flat than the lower surface of the third insulating layer. The second wiring layer has a wiring density that is higher than a wiring density of the first wiring layer.

7 Claims, 17 Drawing Sheets

(51) Int. Cl.
    *H01L 23/498* (2006.01)
    *H01L 25/065* (2006.01)
    *H01L 25/10* (2006.01)
    *H05K 3/34* (2006.01)
    *H05K 3/42* (2006.01)
    *H05K 3/00* (2006.01)

(52) U.S. Cl.
    CPC .... *H01L 23/49827* (2013.01); *H01L 25/0652* (2013.01); *H01L 25/0655* (2013.01); *H01L 25/105* (2013.01); *H05K 1/111* (2013.01); *H05K 1/112* (2013.01); *H01L 2224/16* (2013.01); *H01L 2224/16225* (2013.01); *H01L 2224/32225* (2013.01); *H01L 2224/73204* (2013.01); *H01L 2225/06517* (2013.01); *H01L 2225/1023* (2013.01); *H01L 2225/1058* (2013.01); *H01L 2924/0002* (2013.01); *H01L 2924/01078* (2013.01); *H01L 2924/01079* (2013.01); *H01L 2924/15174* (2013.01); *H01L 2924/15192* (2013.01); *H01L 2924/15311* (2013.01); *H05K 1/118* (2013.01); *H05K 3/0038* (2013.01); *H05K 3/3436* (2013.01); *H05K 3/3452* (2013.01); *H05K 3/429* (2013.01); *H05K 2201/09545* (2013.01); *H05K 2201/09563* (2013.01); *H05K 2201/09827* (2013.01); *H05K 2201/09854* (2013.01); *H05K 2203/025* (2013.01); *H05K 2203/1572* (2013.01)

(58) Field of Classification Search
    CPC ........ H05K 1/111; H05K 1/112; H05K 1/118; H05K 3/3452; H05K 3/103; H05K 3/0061; H05K 3/28; H05K 3/244; H05K 3/323; H05K 3/429; H05K 3/3436; H05K 3/3447; H05K 3/222; H05K 2203/025; H05K 2203/1572; H05K 2201/10287; H05K 2201/09781; H05K 2201/0367; H05K 2201/096; H05K 2201/0355; H05K 2201/055; H01L 23/49811; H01L 23/49822; H01L 23/49827; H01L 25/40652; H01L 25/0655; H01L 25/105; H01L 2224/16225; H01L 2224/32225; H01L 2224/73205; H01L 2225/06517; H01L 2225/1023; H01L 2225/1058; H01L 2924/0002; H01L 2924/15174; H01L 2924/15192; H01L 2924/15311; H01L 2924/01079; H01L 2924/01078; H01L 2924/3011; H01L 23/49572

See application file for complete search history.

(56) References Cited

U.S. PATENT DOCUMENTS

| | | | |
|---|---|---|---|
| 2001/0004134 A1 | 6/2001 | Saitoh | |
| 2004/0235287 A1* | 11/2004 | Inoue | H01L 21/4846 438/612 |
| 2005/0012217 A1 | 1/2005 | Mori et al. | |
| 2006/0141764 A1* | 6/2006 | Oi | H01L 23/49822 438/622 |
| 2006/0163740 A1* | 7/2006 | Ohno | H01L 23/49816 257/762 |
| 2009/0032933 A1* | 2/2009 | Tracht | H01L 21/6835 257/693 |
| 2011/0221069 A1* | 9/2011 | Kunimoto | H01L 23/5389 257/774 |
| 2012/0300425 A1* | 11/2012 | Nakashima | H01L 23/49838 361/761 |
| 2014/0041923 A1* | 2/2014 | Hisada | H05K 1/115 174/266 |
| 2014/0182889 A1* | 7/2014 | Shin | H05K 3/4673 174/251 |

FOREIGN PATENT DOCUMENTS

| | | |
|---|---|---|
| JP | 2003-023252 | 1/2003 |
| JP | 2004-193292 | 7/2004 |
| JP | 2005-136282 | 5/2005 |
| JP | 2007-258542 | 10/2007 |

* cited by examiner

WIRING SUBSTRATE AND SEMICONDUCTOR PACKAGE

CROSS-REFERENCE TO RELATED APPLICATIONS

This application is based upon and claims the benefit of priority of the prior Japanese Patent Application No. 2014-139957 filed on Jul. 7, 2014, the entire contents of which are incorporated herein by reference.

FIELD

The embodiments discussed herein are related to a wiring substrate and a semiconductor package.

BACKGROUND

Conventionally, a build-up substrate having an insulating layer and a wiring layer layered on upper and lower surfaces of a core layer is used as a wiring substrate for a semiconductor package for mounting a semiconductor chip thereon.

In recent years, size-reduction of electronic devices mounted with semiconductor packages is progressing. Along with such progress, further size-reduction and high densification of wiring layers are being demanded for wiring substrates used for semiconductor packages.
Patent Document 1: Japanese Laid-Open Patent Publication No. 2003-023252

However, there are limits to increasing the flatness of the surface of the wiring substrate and reducing the diameter of a via by laser processing. Further, forming the wirings into fine sizes is also limited. Thus, it is difficult to meet the demands for high densification of wiring layers.

SUMMARY

According to an aspect of the invention, there is provided a wiring substrate including a core layer having a first surface and a second surface, a first wiring layer formed on the first surface of the core layer, a first insulating layer being formed on a side of the first surface of the core layer to cover the first wiring layer and including an upper surface, a first via wiring being embedded in the first insulating layer and having a first end surface that is exposed from the upper surface of the first insulating layer, a second wiring layer being formed on the upper surface of the first insulating layer and the first end surface of the first via wiring and being directly bonded to the first end surface of the first via wiring, a second insulating layer being formed on the upper surface of the first insulating layer to cover the second wiring layer, a second via wiring being embedded in the second insulating layer and being electrically connected to the second wiring layer, a third wiring layer formed on the second surface of the core layer, a third insulating layer being formed on a side of the second surface of the core layer and including a lower surface, a third via wiring being embedded in the third insulating layer and being electrically connected to the third wiring layer, and a through-wiring that penetrates the core layer from the first surface to the second surface and electrically connects the first wiring layer and the third wiring layer. The through-wiring includes upper and lower end surfaces. The upper end surface has an area that is smaller than an area of the lower end surface. The upper surface of the first insulating layer is more flat than the lower surface of the third insulating layer. The second wiring layer has a wiring density that is higher than a wiring density of the first wiring layer.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

DESCRIPTION OF EMBODIMENTS

In the following, embodiments of the present invention are described with reference to the accompanying drawings.
<First Embodiment>
[Structure of Wiring Substrate of First Embodiment]

Figure 1A:
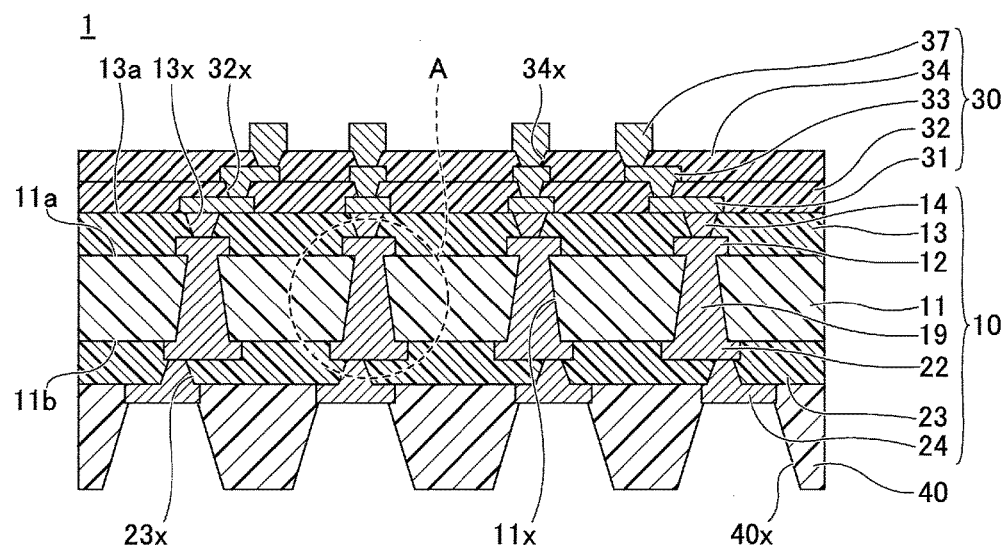
FIGS. 1A and 1B are cross-sectional views illustrating a wiring substrate according to a first embodiment of the present invention.
Figure 1B:
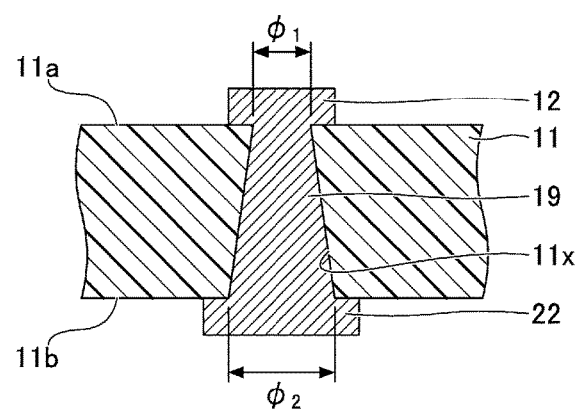

First, a structure of a wiring substrate 1 according to a first embodiment of the present invention is described. FIG. 1A is a cross-sectional view illustrating the wiring substrate 1 of the first embodiment. FIG. 1B is an enlarged view of part A of FIG. 1A.

As illustrated in FIGS. 1A and 1B, the wiring substrate 1 includes a first wiring member 10, a second wiring member 30 layered on one side of the first wiring member 10, and a solder resist layer 40 layered on another side of the first wiring member 10. A plan-view shape of the wiring substrate 1 may be, for example, a rectangular shape. However, the plan-view shape of the wiring substrate 1 is not limited to the rectangular shape and may be an arbitrary shape.

For the sake of convenience, in this embodiment, the side positioned toward a wiring layer 37 of the wiring substrate 1 (upper side in FIG. 1A) may be described as "upper side" or "one side" whereas the side positioned toward the solder resist layer 40 of the wiring substrate 1 (lower side in FIG. 1A) may be described as "lower side" or "other side". Further, a surface of each part (element) positioned toward the side of the wiring layer 37 may be described as "upper surface" or "one surface" whereas a surface of each part (element) positioned toward the solder resist layer 40 may be described as "lower surface" or "other surface". However, the wiring substrate 1 may be used in an upside down state or positioned at a given angle. Further, a "plan view" refers to observing an object from a direction of a line normal to one surface 11a of the core layer 11. Further, a horizontal cross section may refer to a section that is parallel to the one surface 11a of the core layer 11, and a vertical cross-section may refer to a section that is orthogonal to the one surface 11a of the core layer 11.

Next, the first wiring member 10, the second wiring member 30, and the solder resist layer 40 are described. First, the first wiring member 10 is described. The first wiring member 10 is a low density wiring layer including a wiring layer having a wiring density lower than a wiring density of the second wiring member 30. A core layer 11 is provided substantially at a center part of the first wiring member 10. For example, a so-called epoxy glass substrate, which is a substrate having a thermosetting insulating resin (e.g., epoxy type resin) impregnated in a glass cloth, may be used as the core layer 11. The insulating resin may be, for example, a polyimide type resin or a cyanate type resin. Alternatively, the core layer 11 may be a substrate having a thermosetting insulating resin (e.g., epoxy type resin) impregnated in a woven or non-woven cloth made of glass fiber, carbon fiber, or an aramid fiber. The thickness of the core layer 11 may be, for example, approximately 80 μm to 400 μm. The glass cloth and the like are omitted from the drawings.

Multiple through-holes 11x are formed in the core layer 11. The through-hole 11x is a hole in which an upper opening on the side of the one surface 11a of the core layer 11 has an area smaller than an area of a lower opening on the side of the other surface 11b of the core layer 11. The through-hole 11x has a tapered shape in which the area of its horizontal cross section becomes larger from the upper opening on the side of the one surface 11a of the core layer 11 to the lower opening on the side of the other surface 11b of the core layer 11.

The plan view shapes of the upper and lower openings of the through-hole 11x may be, for example, circular shapes. In this case, the through-hole 11x is a hole that has a circular truncated cone shape. However, the vertical cross section of an inner wall of the through-hole 11x is not limited to a straight linear shape but may also be a curved linear shape. From the aspect of reducing stress, the vertical cross section of the inner wall of the through-hole 11x is preferred to be a curved linear shape because stress can be prevented from concentrating at a particular portion.

The through-wiring 19 fills the inside of the through-hole 11x. For example, copper (Cu) may be used as the material of the through-wiring 19. The through-wiring 19 has a tapered shape in which the area of its horizontal cross section becomes larger from an upper end surface (i.e., an end surface that is on the side of the one surface 11a of the core layer 11 and is flush with the one surface 11a of the core layer 11) to a lower end surface (i.e., an end surface that is on the side of the other surface 11b of the core layer 11 and is flush with the other surface 11b of the core layer 11). Although the through-wiring 19 is described to have a circular truncated cone shape, the plan-view shapes of the upper and lower end surfaces of the through-wiring 19 are not limited to circular shapes and may also be other shapes such as elliptical shapes.

The through-wiring 19 having a circular truncated cone shape includes upper and lower end surfaces in which a diameter $\phi_1$ of the upper end surface is smaller than a diameter $\phi_2$ of the lower end surface. The diameter $\phi_1$ of the upper end surface of the through-wiring 19 may be, for example, approximately 100 μm to 120 μm. The diameter $\phi_2$ of the lower end surface of the through-wiring 19 may be, for example, approximately 130 μm to 150 μm. The pitch between the through-wirings 19 may be, for example, approximately 200 μm to 400 μm.

The thermal expansion coefficients of the core layer 11 and the through-wiring 19 is different. For example, in a case where the core layer 11 is a so-called glass epoxy substrate, the thermal expansion coefficient of the core layer 11 is approximately 25 ppm/° C. On the other hand, in a case where the through-wiring 19 is formed of copper, the thermal expansion coefficient of the through-wiring 19 is approximately 18 ppm/° C. Due to this difference of thermal coefficients between the core layer 11 and the through-wiring 19, a pressure that forces the through-wiring 19 to project from the core layer 11 may be generated when heat is applied during a process of manufacturing the wiring substrate 1 or during the actual use of the wiring substrate 1.

In a case where the upper end surface of the through-wiring 19 projects from one surface 11a of the core layer 11 to the side of the insulating layer 13 according to the thermal history of applying heat to the wiring substrate 1, an upper surface of the wiring layer 12, an end surface of the wiring layer 14, and an upper surface 13a of the insulating layer 13 also projects in conformity with the upper end surface of the through-wiring 19. As a result, irregularities are formed on the upper surface 13a of the insulating layer 13. Such irregularities makes it difficult to forma fine wiring layer (below-described wiring layer 31) on the upper surface 13a of the insulating layer 13. Further, in a case where the through-wiring 19 projects from the one surface 11a of the core layer 11 to the side of the insulating layer 13 after the fine wiring layer (below-described wiring layer 31) is formed, problems such as falling of the fine wiring layer (below-described wiring layer 31) may occur.

Therefore, in the wiring substrate 1, the through-wiring 19 is formed in a circular truncated cone shape in which the diameter $\phi_1$ of the upper end surface is smaller than the diameter $\phi_2$ of the lower end surface. By forming the through-wiring 19 into the circular truncated cone shape, a pressure that forces the through-wiring 19 to project to the side of the other surface 11b of the core layer 11 is generated when heat is applied. Thereby, the through-wiring 19 can be prevented from projecting to the side of the one surface 11a of the core layer 11. Even if the lower end surface of the through-wiring 19 projects from the other surface 11b of the core layer 11 to form some irregularities on the lower surface of the insulating layer 23, such irregularities are not a problem because a high-density wiring layer is not formed on the side of the other surface 11b of the core layer 11.

Returning to the description of the embodiment illustrated in FIG. 1, a wiring layer 12, an insulating layer 13, and a wiring layer 14 are sequentially layered on the one surface 11a of the core layer 11. A wiring layer 22, an insulating layer 23, and a wiring layer 24 are sequentially layered on the other surface 11b of the core layer 11. The wiring layer 12 is a representative example of a first wiring layer of this invention. The wiring layer 14 is a representative example of a first via wiring of this invention. The insulating layer 13 is a representative example of the first insulating layer of this invention. The wiring layer 22 is a representative example of a third wiring layer of this invention. The insulating layer 23 is a representative example of the third insulating layer of this invention.

The wiring layer 12 may be a pad or a wiring pattern formed on the one surface 11a of the core layer 11. The wiring layer 22 may be a pad or a wiring pattern formed on the other surface 11b of the core layer 11. The wiring layer 12 is electrically connected to the wiring layer 22 by way of the through-wiring 19 penetrating the core layer 11. Apart of the wiring layer 12 functioning as a pad may have a diameter that is smaller than a diameter of a part of the wiring layer 22 functioning as a pad in correspondence with the diameters of the upper and lower end surfaces of the through-wiring 19. For example, copper (Cu) may be used as the material of the wiring layers 12, 22. The thicknesses of the wiring layers 12, 22 may be, for example, approximately 10 μm to 20 μm. A line/space of the wiring layers 12, 22 may be, for example, approximately 20 μm/20 μm.

It is to be noted that the "line" of the "line/space" represents a wiring width, and the "space" of the "line/space" represents an interval (wiring interval) between adjacent wirings. For example, in a case where the line/space is 20 μm/20 μm the wiring width is 20 μm and the interval between adjacent wirings is 20 μm.

The insulating layer 13 is formed on the side of the one surface 11a of the core layer 11. More specifically, the insulating layer 13 is formed on the one surface 11a of the core layer 11 to cover the wiring layer 12. For example, a non-photosensitive insulating resin (e.g., thermosetting resin) having an epoxy type resin as a main component may be used as the material of the insulating layer 13. Alternatively, other non-photosensitive insulating resins having a polyimide type resin or the like as a main component may be used as the material of the insulating layer 13. The thickness of the insulating layer 13 is, for example, approximately 40 μm to 75 μm. The insulating layer 13 may include a filler such as silica ($SiO_2$).

It is not preferable to use a photosensitive insulating resin for the insulating layer 13. Because a layer of a photosensitive insulating resin is typically formed by applying a resin liquid, it is difficult to form a thick layer by using the photosensitive insulating resin. Accordingly, in a case where a photosensitive insulating resin is used to form the insulating layer 13, the layer of the photosensitive insulating resin would have a shape corresponding to an irregular shape formed by the wiring layer 12 and the one surface 11a of the core layer 11a having a thickness of approximately 15 μm to 35 μm. Thus, the upper surface 13a of the insulating layer 13 cannot be flat.

The wiring layer 14 is a via wiring embedded in the insulating layer 13. More specifically, the wiring layer 14 is a via wiring that fills the inside of the via hole 13x that penetrates the insulating layer 13 and exposes the one surface of the wiring layer 12. The wiring layer 14 is electrically connected to the wiring layer 12. The via hole 13x is a recess including an opening on a side of the second wiring member 30 and a bottom surface formed by an upper surface of the wiring layer 12. The area of the opening on the side of the second wiring member 30 is larger than the area of the bottom surface of the recess. For example, in a case where the openings on both sides of the via hole 13x are circular shapes, the via hole 13x is a recess having an inverted circular truncated cone shape. In this case, the diameter of the opening of the via hole 13x on the side of the second wiring member 30 may be, for example, approximately 50 μm to 70 μm.

Owing to this shape of the via hole 13x, one end surface of the wiring layer 14 (end surface on the side of the second wiring member 30) has an area that is greater than an area of another end surface of the wiring layer 14 (end surface on the side of the core layer 11). The one end surface of the wiring layer 14 may be flush with, for example, the upper surface 13a of the insulating layer 13. The one surface of the wiring layer 14 is exposed from the upper surface 13a of the insulating layer 13 and is directly bonded to the wiring layer 31 of the second wiring member 30. Further, the other end surface of the wiring layer 14 is directly bonded to the upper surface of the wiring layer 12 inside the insulating layer 13. The material of the wiring layer 14 may be, for example, the same material used to form the wiring layer 12.

In order to increase the flatness of the upper surface 13a of the insulating layer 13, the upper surface 13a of the insulating layer 13 may be a polished surface having an average roughness Ra of, for example, approximately 15 nm to 40 nm. This roughness is approximately 1/10 compared to the roughness before the upper surface 13a of the insulating layer 13 is polished. By reducing the roughness of the upper surface 13a of the insulating layer 13 to improve the flatness of the upper surface 13a of the insulating layer 13, the wiring layer 31, which is a fine wiring (high density wiring pattern), can be formed on the upper surface 13a of the insulating layer 13. Because the one end surface of the wiring layer 14 is also polished when polishing the upper surface 13a of the insulating layer 13, the one end surface of the wiring layer 14 is also a polished surface.

Accordingly, with the above-described embodiment, the wiring layer 14 on the side of the second wiring member 30 is formed only of a via wiring formed in the via hole 13x of the insulating layer 13. That is, the wiring layer 14 has no wiring pattern that is integrally formed with the upper surface 13a of the insulating layer 13. Although the wiring layer 14 and the wiring layer 31 are electrically connected to each other, the wiring layer 14 and the wiring layer 31 are not integrated with each other. Owing to this structure, the upper surface 13a of the insulating layer 13 and the one end surface of the wiring layer 14 can be formed into flat surfaces. A high density wiring pattern can be formed as the wiring layer 31 on the insulating layer 13 and the one end surface of the wiring layer 14. More specifically, a high density wiring pattern having a line/space of less than or equal to 5 μm/5 μm can formed. For example, a high density wiring pattern having a line/space of approximately 2 μm/2 μm can be formed.

In a case where a semi-additive method is used to form the wiring layer 31 in the below-described manufacturing method, the wiring layer 31 has a structure that includes an electroplated layer layered on a seed layer. Further, one end surface of the wiring layer (via wiring) 14 is directly bonded to the seed layer (e.g., a layered structure formed of titanium (Ti) and copper (Cu)) of the wiring layer 31.

The insulating layer 23 is formed on the side of the other surface 11b of the core layer 11. More specifically, the insulating layer 23 is formed on the other surface 11b of the core layer 11 to cover the wiring layer 22. The material of the insulating layer 23 may be, for example, the same material used to form the insulating layer 13. The insulating layer 23 may include a filler such as silica ($SiO_2$).

The thickness of the insulating layer 23 may be approximately 3 μm to 5 μm thicker than the insulating layer 13. The thicknesses are different because the upper surface 13a of the insulating layer 13 is a polished surface whereas the lower surface of the insulating layer 23 is not polished. That is, although the insulating layer 13 and the insulating layer 23 have substantially the same thicknesses before a polishing process, the insulating layer 13 is approximately 3 µm to 5 µm thinner than the insulating layer 23 because only the upper surface 13a of the insulating layer 13 is polished. Because the lower surface of the insulating layer 23 is unpolished, the flatness of the lower surface of the insulating layer 23 is less than that of the polished upper surface 13a of the insulating layer 13. The unpolished lower surface of the insulating layer 23 may have an average roughness Ra of, for example, approximately 300 nm to 400 nm whereas the polished upper surface 13a of the insulating layer 13 may have an average roughness Ra of, for example, approximately 15 nm to 40 nm.

The wiring layer 24 is formed on the other side of the insulating layer 23 and is electrically connected to the wiring layer 22. The wiring layer 24 includes a via wiring that fills the inside of a via hole 23x that penetrates the insulating layer 23 and exposes the other surface of the wiring layer 22. The wiring layer 24 also includes a wiring pattern formed on the lower surface of the insulating layer 23. The via hole 23x is a circular truncated cone-shaped recess including an opening on a side of the solder resist layer 40 and a bottom surface formed by a lower surface of the wiring layer 22. The area of the opening on the side of the solder resist layer 40 is larger than the area of the bottom surface of the recess. The diameter of the opening of the via hole 23x may be, for example, approximately 50 µm to 70 µm.

The material of the wiring layer 24 and the thickness of the wiring pattern of the wiring layer 24 may be the same as those of the wiring layer 12. The line/space of the wiring pattern of the wiring layer 24 may be, for example, approximately 20 µm/20 µm.

Accordingly, the same number of insulating layers and wiring layers may be formed on both surfaces of the core layer 11 of the first wiring member 10. That is, the first wiring member 10 may have a layered structure in which the insulating layers and the wiring layers are vertically symmetric to each other with the core layer 11 as their center. Therefore, the first wiring member 10 has a structure that is resistant to warping. Particularly, because the balance between the top and the bottom of the first wiring member 10 is enhanced by forming each of the insulating layers with substantially the same thickness, the structure of the first wiring member 10 is resistant to warping.

Next, the second wiring member 30 is described. The second wiring member 30 is a high density wiring layer that includes a wiring layer having a higher wiring density than the first wiring member 10. The second wiring member 30 includes a wiring layer 31, an insulating layer 32, a wiring layer 33, an insulating layer 34, and a wiring layer 37 that are sequentially layered on the first wiring member 10. The wiring layer 31 is a representative example of a second wiring layer according to an embodiment of the present invention, and the insulating layer 32 is a representative example of an second insulating layer according to an embodiment of the present invention.

The thickness of the second wiring member 30 (the part of the second wiring member 30 including the insulating layers 32, 34 and the wiring layers 31, 33) may be, for example, approximately 20 µm to 40 µm. In this embodiment, the thickness of the second wiring member 30 refers to the thickness of a layered part of the second wiring member 30 that does not include a projecting part of the wiring layer 37 and includes only the insulating layers 32, 34.

The wiring layer 31 is a wiring pattern formed on the upper surface 13a of the insulating layer 13 and the one end surface of the wiring layer 14 of the first wiring member 10. A part of the lower surface of the wiring layer 31 contacts the one end surface of the wiring layer 14 (i.e., via wiring of the first wiring member 10), so that the wiring layer 31 and the wiring layer 14 are electrically connected to each other. For example, copper (Cu) may be used as the material of the wiring layer 31. Alternatively, the wiring layer 31 may be a layered structure constituted by a copper layer and another metal layer. The thickness of the wiring layer 31 may be, for example, approximately 1 µm to 3 µm. The line/space of the wiring layer 31 may be, for example, approximately 2 µm/2 µm.

The insulating layer 32 is formed on the upper surface 13a of the insulating layer 13 of the first wiring member 10 to cover the wiring layer 31. The insulating layer 32 is thinner than the insulating layer 13. A photosensitive insulating resin may be used as the material of the insulating layer 32. For example, a material having a polyimide type resin or a phenol type resin as a main component may be used as the material of the insulating layer 32. The thickness of the insulating layer 32 may be, for example, approximately 5 µm to 10 µm.

It is preferable for the insulating layer 32 to contain no filler or to contain a filler that is less than the amount of filler contained in the insulating layer 13 (e.g., filler having a particle diameter of approximately 1 µm). This is because a large amount of filler contained in the insulating layer 32 causes irregularities to be easily formed on the upper surface of the insulating layer 32 and makes it difficult to form a high density wiring layer 33 on the upper surface of the insulating layer 32. Further, a large amount of filler contained in the insulating layer 32 makes exposure difficult in a photolithography process.

The wiring layer 33 is formed on one side of the insulating layer 32 and is electrically connected to the wiring layer 31. The wiring layer 33 includes a via wiring that fills the inside of the via hole 32x that penetrates the insulating layer 32 and exposes the one surface of the wiring layer 32. The wiring layer 33 also includes a wiring pattern formed on the one surface of the insulating layer 32. The via hole 32x is an inverted circular truncated cone-shaped recess including an opening on a side of the insulating layer 34 and a bottom surface formed by an upper surface of the wiring layer 31. The area of the opening on the side of the insulating layer 34 is larger than the area of the bottom surface of the recess. The diameter of the opening of the via hole 32x may be, for example, approximately 10 µm to 20 µm.

The material of the wiring layer 33 and the thickness and line/space of the wiring pattern of the wiring layer 33 may be, for example, the same as those of the wiring layer 31. The thickness of the wiring layer 31 is approximately 1 µm to 3 µm and is less than the thickness of the wiring layer 12 that is approximately 15 µm to 35 µm. Therefore, the upper surface of the insulating layer 32 can be flat even in a case where a photosensitive insulating resin (thickness of approximately 5 µm to 10 µm) that is more difficult to form a thick layer compared to a non-photosensitive insulating resin (thickness of approximately 40 µm to 75 µm) is used to form the insulating layer 32. As a result, the wiring layer 33 having substantially the same high density as the wiring layer 31 can be formed on the upper surface of the insulating layer 32.

Further, in a case of forming each insulating layer 32, 34 of the second wiring member 30 by using a photosensitive insulating resin, the via holes of the second wiring member 30 can be formed by a photolithography method. Thereby, the via holes of the second wiring member 30 can be formed having small plan-view shapes. By forming the via holes with small plan-view shapes, the plan-view shapes of the pads that are connected to the upper and lower sides of the second wiring member 30 byway of the via holes can also be small. This is advantageous for achieving high densification of adjacent wiring layers 31, 33 in each of the insulating layers 32, 34 of the second wiring member 30.

Because the insulating layers 32, 34 of the second wiring member 30 contain no filler or contains only a small amount of filler (e.g., filler having a particle diameter of approximately 1 μm), irregularities due to filler can be prevented from being formed on the surfaces of each insulating layer 32, 34 of the second wiring member 30. As a result, high densification of wiring layers can be achieved in each of the insulating layers 32, 34.

The insulating layer 34 is formed on the one surface of the insulating layer 32 to cover the wiring layer 33. The material and thickness of the insulating layer 34 may be, for example, the same as those of the insulating layer 32. For the same reason as the insulating layer 32, it is preferable for the insulating layer 34 to contain no filler or to contain a filler that is less than the amount of filler contained in the insulating layer 13.

The wiring layer 37 is formed on one side of the insulating layer 34. The wiring layer 37 includes a via wiring that fills the inside of the via hole 34x that penetrates the insulating layer 34 and exposes one surface of the wiring layer 33. The wiring layer 37 also includes a pad that projects from one surface of the insulating layer 34. The via hole 34x is an inverted circular truncated cone-shaped recess including an opening on a side of a pad and a bottom surface formed by an upper surface of the wiring layer 33. The area of the opening on the side of the pad is larger than the area of the bottom surface of the recess. The diameter of the opening of the via hole 34x may be, for example, approximately 10 μm to 20 μm.

The material of the wiring layer 37 may be, for example, the same material used for the wiring layer 31. The thickness of the wiring layer 37 may be, for example, approximately 10 μm (including a pad(s) projecting from the one surface of the insulating layer 34). The plan-view shape of the pad of the wiring layer 37 may be, for example, a circular shape having a diameter of approximately 20 μm to 30 μm. The pitch between the pads of the wiring layer 37 may be, for example, approximately 40 μm to 50 μm. The pads of the wiring layer 37 function as electronic component mounting pads for mounting and electrically connecting an electronic component such as a semiconductor chip.

A surface processed layer (not illustrated) may be formed on a surface (upper surface only or upper and side surfaces) of the pad of the wiring layer 37. The surface processed layer may be, for example, a gold layer (Au), a nickel/gold (Ni/Au) layer (i.e. metal layer including a Ni layer and an Au layer layered in this order), or a nickel/palladium/gold (Ni/Pd/Au) layer (i.e. metal layer including an Ni layer, a Pd layer, and an Au layer layered in this order). Further, the surface processed layer may be formed by performing an oxidation preventing process such as an OSP (Organic Solderability Preservative) process on the surface (upper surface only or upper and side surfaces) of the pad of the wiring layer.

Next, the solder resist layer 40 is described. The solder resist layer 40 is an outermost insulating layer that allows the wiring layer 24 of the first wiring member 10 to be selectively exposed from the lower surface of the insulating layer 23 of the first wiring member 10. For example, a photosensitive insulating resin (e.g., thermosetting resin) having a phenol type resin or polyimide type resin as a main component may be used as the material of the solder resist layer 40. The solder resist layer 40 may include a filler such as silica ($SiO_2$).

The solder resist layer 40 includes an opening 40x having a bottom part that exposes a part of the wiring layer 24 of the first wiring member 10. The wiring layer 24 exposed at the bottom part of the opening 40x functions as a pad that is electrically connected to a mounting substrate such as a motherboard.

By improving the balance between the upper side and the lower side of the wiring substrate 1 by adjusting the balance between the thickness of the insulating layers of the second wiring member 30 (total thickness of the insulting layers 32, 34) and the thickness of the solder resist layer 40, the wiring substrate 1 becomes resistant to warping. For example, the thickness of the solder resist layer 40 may be greater than or equal to the thickness of the insulating layers of the second wiring member 30 (total thickness of the insulting layers 32, 34). More specifically, it is preferable for the ratio between the thickness of the solder resist layer 40 and the thickness of the second wiring member 30 to approximately 0.75 to 1 from the standpoint of preventing warping.

In the wiring substrate 1, the elastic modulus (elastic shear modulus=transverse elasticity modulus) of the core layer 11 is preferred to be approximately 30 GPa, and the thermal expansion coefficient of the core layer 11 is preferred to be approximately 10 ppm/° C. to 30 ppm/° C. Further, the insulating layers 13, 23 having non-photosensitive insulating resins as their main component are preferred to have an elastic modulus of approximately 5 GPa to 15 GPa and a thermal expansion coefficient of approximately 10 ppm/° C. to 40 ppm/° C., respectively. Further, the insulating layers 32, 34 having photosensitive insulating resins as their main component are preferred to have an elastic modulus of approximately 5 GPa and a thermal expansion coefficient of approximately 50 ppm/° C. to 70 ppm/° C., respectively. Further, the solder resist layer 40 having a photosensitive insulating resin as a main component is preferred to have an elastic modulus of approximately 2 GPa to 4 GPa and a thermal expansion coefficient of approximately 40 ppm/° C. to 50 ppm/° C., respectively.

The thermal coefficient of each insulating layer can be adjusted to a predetermined value by, for example, adjusting the amount of filler contained in the insulating layer. However, in a case where the insulating layer is an insulating layer having a photosensitive insulating resin as a main component, exposure becomes difficult as the amount of filler increases. Therefore, there is a limit (upper limit) in the amount of filler that can be contained in the insulating layer. Thus, the thermal coefficient of an insulating layer having a photosensitive insulating resin as a main component tends to be greater than the thermal coefficient of an insulating layer having a non-photosensitive insulating resin as a main component. Besides using silica ($SiO_2$) as the filler, kaolin ($Al_2Si_2O_5(OH_4)$), talc ($Mg_3Si_4O_{10}(OH_2)$), alumina ($Al_2O_3$) may be used as the material of the filler. Alternatively, a mixture of these materials may be used as the filler.

By forming the layers with physical properties (elastic modulus and thermal coefficient) having the above-described values, the wiring substrate 1 gradually becomes softer as layers become further outward with respect to the core layer 11 as the center. Owing to the synergic effect between the thickness of the solder resist layer 40 and the thickness of the second wiring member 30, the warping of the wiring substrate 1 is prevented.

<Method for Manufacturing Wiring Substrate of First Embodiment>

Next, a method for manufacturing a wiring substrate according to the first embodiment of the present invention is described. FIGS. 2A-7B are schematic diagrams illustrating processes for manufacturing a wiring substrate of the first embodiment. In the processes of the below-described embodiment, multiples wiring substrates are manufactured by fabricating multiple parts that are to become wiring substrates and individualized into separate pieces. However, the processes of the below-described embodiment may be applied to manufacturing a single wiring substrate.

The processes illustrated in FIGS. 2A to 4A are processes for fabricating the first wiring member 10. First, in the process illustrated in FIG. 2A, a substrate having a flat sheet metal foil 120 layered on the one surface 11a of the core layer 11 and a flat sheet metal foil 220 layered on the other surface 11b of the core layer 11 is prepared. Multiple through-holes 11x are formed in the substrate. For example, a so-called epoxy glass substrate, which is a substrate having a thermosetting insulating resin (e.g., epoxy type resin) impregnated in a glass cloth, may be used as the core layer 11.

Alternatively, the core layer 11 may be a substrate having a thermosetting insulating resin (e.g., epoxy type resin) impregnated in a woven or non-woven cloth made of glass fiber, carbon fiber, or an aramid fiber. The thickness of the core layer 11 may be, for example, approximately 80 μM to 400 μm. For example, a copper foil having a thickness of approximately 15 μm to 35 μm may be used as each of the metal foils 120, 220.

The through-hole 11x that exposes the lower surface of the metal foil 120 may be formed by radiating a laser (e.g., $CO_2$ laser) from the side of the other surface 11b of the core layer 11 by way of the metal foil 220. However, the metal foil 120 may be partly penetrated depending on the diameter and output of the laser. The through-hole 11x may be a circular truncated cone-shaped recess including an upper opening exposing the lower surface of the metal foil 120 and a lower opening on the side of the other surface 11b of the core layer 11. The upper opening of the through-hole 11x has an area larger than an area of the lower opening of the through-hole 11x. Although a circular cylindrical-shaped through-hole can be formed by using a drilling method, the through-hole 11x can be formed into a circular truncated cone shape by using a laser processing method.

Figure 2A:
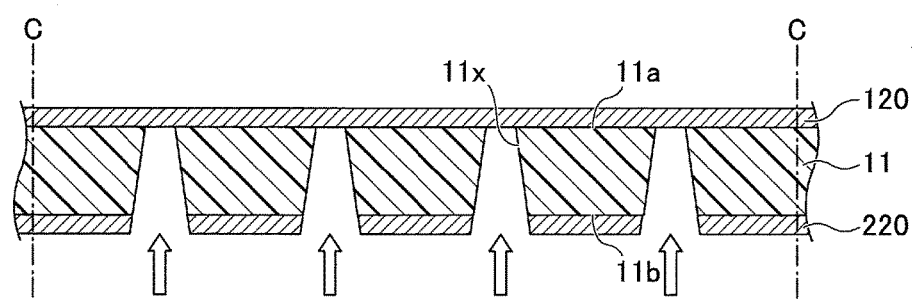
FIGS. 2A-7B are schematic diagrams illustrating processes for manufacturing a wiring substrate according to the first embodiment of the present invention.
Figure 2B:
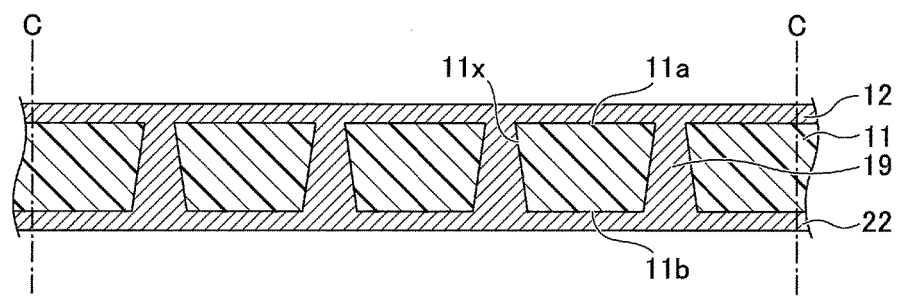

In the process illustrated in FIG. 2B, the through-wiring 19 is formed inside each through-hole 11x along with forming the wiring layer 12 entirely on the one surface 11a of the core layer 11 and forming the wiring layer 22 entirely on the other surface 11b of the core layer 11. More specifically, the metal foils 120, 220 are removed by etching. Then, a seed layer (e.g., copper) that consecutively covers the one surface 11a of the core layer 11, the inner wall surface of the through-hole 11x, and the other surface 11b of the core layer 11 is formed by using, for example, an electroless plating method. Then, an electroplating method using the seed layer as a power-feeding layer is performed to fill the inside of the through-hole 11x with copper or the like and form an electroplating layer on the one surface 11a and the other surface 11b of the core layer 11. Thereby, the through-wiring 19 is formed in the through-hole 11x, the wiring layer 12 is formed entirely on the one surface 11a of the core layer 11, and the wiring layer 22 is formed entirely on the other surface 11b of the core layer 11.

Figure 2C:
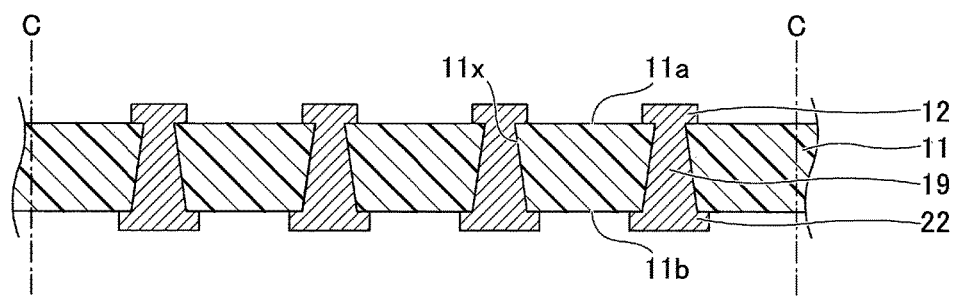

Then, in the process illustrated in FIG. 2C, the wiring layer 12 on the one surface 11a of the core layer 11 and the wiring layer 22 on the other surface 11b of the core layer 11 are formed (patterned) into predetermined flat shapes by using, for example, a subtractive method. The wiring layer 12 and the wiring layer 22 are electrically connected to each other by way of the through-wiring 19.

Figure 3A:
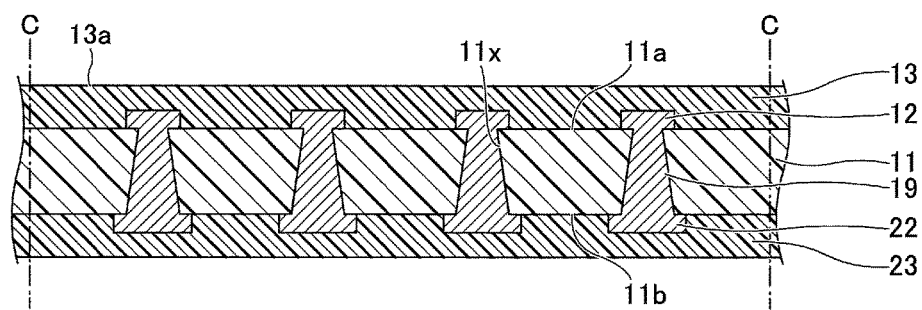

Then, in the process illustrated in FIG. 3A, the insulating layer 13 is formed on the one surface 11a of the core layer 11 to cover the wiring layer 12. Further, the insulating layer 23 is formed on the other surface 11b of the core layer 11 to cover the wiring layer 22. For example, a non-photosensitive insulating resin (e.g., thermosetting resin) having an epoxy type resin as a main component may be used as the material of the insulating layers 13, 23. The thickness of each of the insulating layers 13, 23 may be, for example, approximately 40 μm to 75 μm. The insulating layers 13, 23 may include a filler such as silica ($SiO_2$).

More specifically, a film-like insulating resin in a non-cured state is laminated on the one surface 11a of the core layer 11 to cover the wiring layer 12. Further, a film-like insulating resin in a non-cured state is laminated on the other surface 11b of the core layer 11 to cover the wiring layer 22. Then, the laminated insulating resins are cured by applying pressure to the insulating resins and heating the insulating resins at a temperature greater than or equal to a predetermined thermosetting temperature. Thereby, the insulating layers 13, 23 are formed. By laminating the insulating resins in a vacuum atmosphere, the forming of voids can be prevented.

By roughening the upper surface of the wiring layer 12 and the lower surface of the wiring layer 22 before forming the insulating layers 13, 23, the adhesiveness between the wiring layers 12, 22 and the insulating layers 13, 23 can be increased. Therefore, it is preferable to roughen the upper surface of the wiring layer 12 and the lower surface of the wiring layer 22 before forming the insulating layers 13, 23. The roughening of the upper surface of the wiring layer 12 and the lower surface of the wiring layer 22 may be performed by a wet-etching method using formic acid.

Figure 3B:
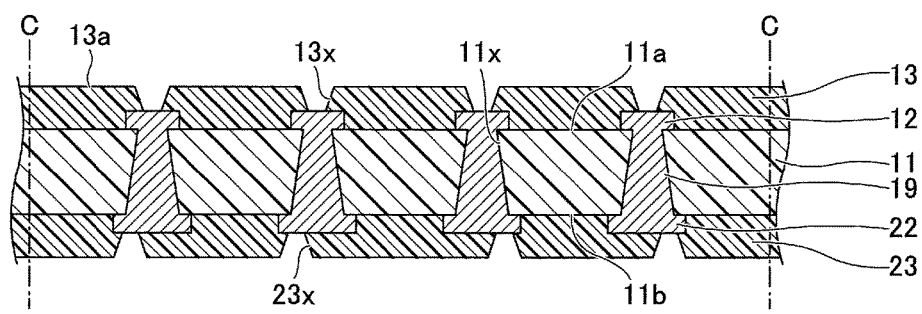

Then, in the process illustrated in FIG. 3B, the via hole 13x penetrating the insulating layer 13 and exposing the upper surface of the wiring layer 12 is formed in the insulating layer 13. Further, the via hole 23x penetrating the insulating layer 23 and exposing the lower surface of the wiring layer 22 is formed in the insulating layer 23. The via holes 13x, 23x may be formed by using, for example, a laser processing method using a $CO_2$ laser or the like. After forming the via holes 13x, 23x with the laser processing method, it is preferable to perform a desmearing process to remove residual resin adhered to the upper surface of the wiring layer 12 and the lower surface of the wiring layer 22 that are exposed at the bottom parts of the via holes 13x, 23x. In a case where the desmearing method is used, the inner wall surfaces of the via holes 13x, 23x and the upper surfaces of the insulating layers 13, 23 become roughened surfaces.

Figure 3C:
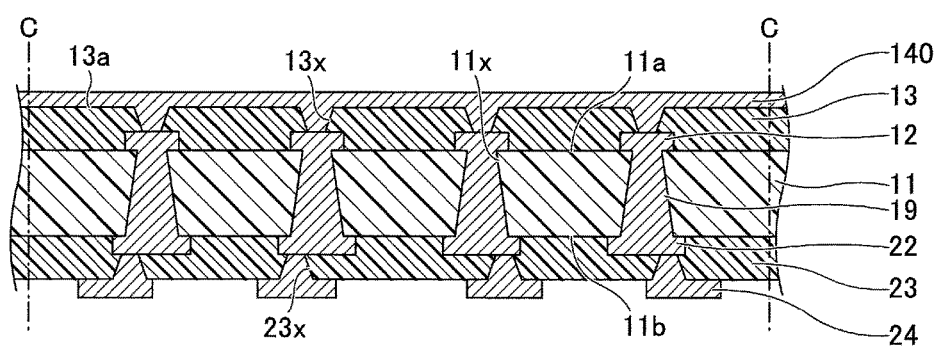
Figure 4A:
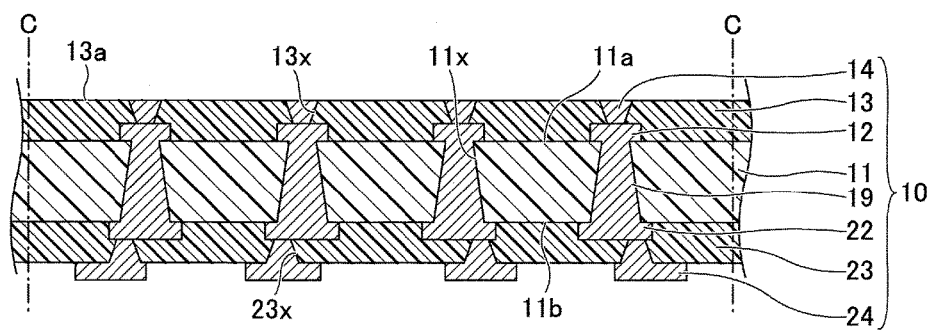

Then, in the process illustrated in FIG. 3C, the metal layer 140 is formed on the one side of the insulating layer 13, and the wiring layer 24 is formed on the other side of the insulating layer 23. The metal layer 140 that is to become the wiring layer 14 illustrated in FIG. 4A is formed to fill the inside of the via hole 13x and extend to the upper surface 13a of the insulating layer 13. The metal layer 140 may be formed entirely on the upper surface 13a of the insulating layer 13. However, a part of the metal layer 140 that is formed on the upper surface 13a of the insulating layer 13 is removed by grinding in a latter process. Therefore, the metal layer 140 may be formed to fill the inside of the via hole 13x and extend only to apart of the upper surface 13a of the insulating layer 13 at the vicinity of the via hole 13x.

The metal layer 140 is electrically connected to the wiring layer 12 exposed at the bottom part of the via hole 13x. The wiring layer 24 includes a via wiring filled in the via hole 23x that penetrates the insulating layer 23 and exposes the other surface of the wiring layer 22. The wiring layer 24 is electrically connected to the wiring layer exposed at the bottom part of the via hole 23x.

For example, copper (Cu) may be used as the material of the metal layer 140 and the wiring layer 24. The metal layer 140 and the wiring layer 24 may be formed by, for example, a semi-additive method. More specifically, the metal layer 140 and the wiring layer 24 are formed as follows.

To form the metal layer 140, first, a seed layer (not illustrated) made of copper (Cu) or the like is formed on the upper surface of the wiring layer 12 exposed at the bottom part of the via hole 13x and the entire upper surface 13a of the insulating layer 13 including the inner wall surface of the via hole 13x. The seed layer may be formed by using an electroless plating method or a sputtering method. Then, an electroplating layer made of copper (Cu) or the like is formed on the seed layer by an electroplating method using the seed layer as a power-feeding layer. Thereby, the metal layer 140 having the electroplating layer layered on the seed layer is formed. In this case, the metal layer 140 is formed entirely on the upper surface 13a of the insulating layer 13. In a case of selectively forming the metal layer 140 on the upper surface 13a of the insulating layer 13, the metal layer 140 may formed by the same method for forming the wiring layer 24 described below.

To form the wiring layer 24, first, a seed layer (not illustrated) made of copper (Cu) or the like is formed on the lower surface of the wiring layer 22 exposed at the bottom part of the via hole 23x and the entire lower surface of the insulating layer 23 including the inner wall surface of the via hole 23x. The seed layer may be formed by using an electroless plating method or a sputtering method. Then, a resist layer (not illustrated) having an opening corresponding to the wiring layer 24 is formed on the seed layer. Then, an electroplating layer made of copper (Cu) or the like is formed in the opening of the resist layer by an electroplating method using the seed layer as a power-feeding layer.

Then, after the resist layer is removed, the electroplating layer is used as a mask to etch (remove) a part of the seed layer that is not covered by the electroplating layer. Thereby, the wiring layer 24 having the electroplating layer layered on the seed layer is formed.

In this case, the metal layer 140 and the wiring layer 24 include the electroplating layer layered on the seed layer, the seed layer (and other wiring layers) are omitted from the drawings.

Then, in the process illustrated in FIG. 4A, the wiring layer 14, the upper surface 13a of the insulating layer 13 and the upper surface of the metal layer 140 filled in the via hole 13x are exposed by polishing the metal layer 140. Thereby, the wiring layer 14 that is the via wiring filled in the via hole 13x is formed. The upper surface of the wiring layer 14 may be, for example, flush with the upper surface 13a of the insulating layer 13.

The wiring layer 14 is formed by removing the metal layer 140 except for the metal layer filled in the via hole 13x illustrated in FIG. 3C. For example, the metal layer 14 may be removed by polishing the metal layer 140 except for the metal layer 140 filled in the via hole 13x by using a CMP (Chemical Mechanical Polishing) method. In this process, a part of the upper surface 13a of the insulating layer 13 may be removed at the same time. For example, approximately 3 µm to 5 µm of the upper surface 13a of the insulating layer 13 may be removed. Because the thickness of the insulating layer 13 and the thickness of the insulating layer 23 are substantially the same before the polishing process, the thickness of the insulating layer 13 becomes approximately 3 µm to 5 µm less than the thickness of the insulating layer 23 after the polishing process.

By polishing the upper surface 13a of the insulating layer 13 along with the metal layer 140 and removing apart of the upper surface 13a of the insulating layer 13, the roughness of the upper surface 13a of the insulating layer 13 can be reduced compared to the roughness before the polishing process. That is, the flatness of the upper surface 13a of the insulating layer 13 can be improved. The roughness of the upper surface 13a of the insulating layer 13 before performing the CMP method (before polishing) is, for example, an average roughness Ra of approximately 300 nm to 400 nm. The roughness of the upper surface 13a of the insulating layer 13 after performing the CMP method can be an average roughness Ra of approximately 15 nm to 40 nm. By reducing the roughness of the upper surface 13a of the insulating layer 13 to improve the flatness of the upper surface 13a of the insulating layer 13, a fine wiring (high density wiring pattern) can be formed in a subsequent process. By performing the above-described processes, the manufacturing of the first wiring member 10 is completed.

Because the amount of copper used for the via wirings formed in each insulating layer is significantly small compared to the amount of copper used to form the through-wiring 19, the forming of high density wirings is not affected by the projection of the via wirings.

The processes illustrated in FIGS. 4B to 7A are processes for fabricating the second wiring member 30. First, in the processes illustrated in FIGS. 4B to 5B, the wiring layer 31 having a predetermined flat shape is formed (patterned) on the upper surface 13a of the insulating layer 13 of the first wiring member 10. The wiring layer 31 is electrically connected to the wiring layer 14 of the first wiring member 10. The wiring layer 31 is formed by, for example, a semi-additive method.

Figure 4B:
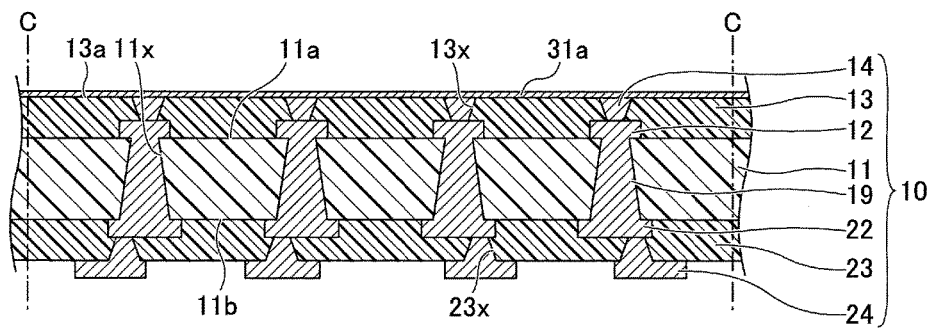

More specifically, as illustrated in FIG. 4B, a seed layer 31 is formed on a flat surface formed by the upper surface 13a of the insulating layer 13 and the upper surface of the wiring layer 14. The seed layer 31 is formed by, for example, a sputtering method and includes a layer of titanium (Ti) and a layer of copper (Cu). The titanium (Ti) layer may have a thickness of, for example, approximately 20 nm to 50 nm, and the copper (Cu) layer may have a thickness of, for example, 100 nm to 300 nm.

By forming the titanium (Ti) layer as a lower layer of the seed layer 31a, the adhesiveness between the insulating layer 13 and the wiring layer 31 can be improved. Alternatively, titanium nitride (TiN) or the like may be used instead of titanium (Ti). Titanium (Ti) and titanium nitride (TiN) are metals having high corrosion resistance. Although an electroless plating method may be used to form the seed layer 31a, a thinner layer can be formed by using the sputtering method. Therefore, using the sputtering method is advantageous for high densification of the wiring layer.

Figure 4C:
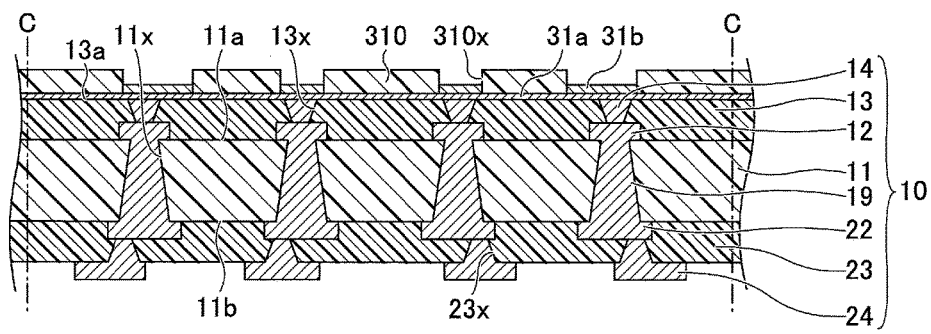

Then, as illustrated in FIG. 4C, the resist layer 310 having openings 310x corresponding to the wiring layer 31 is formed on the seed layer 31a. Then, the electroplating layer 31b made of copper (Cu) or the like is formed in the openings 310x of the resist layer 310 by an electroplating method using the seed layer 31a as a feed layer.

Figure 5A:
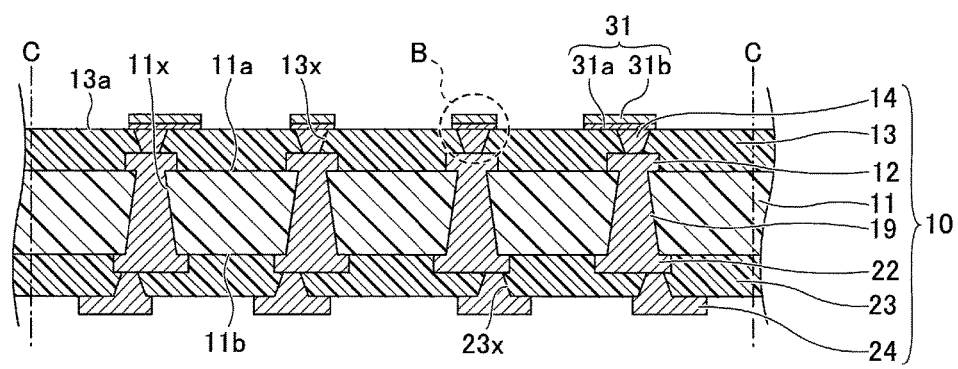
Figure 5B:
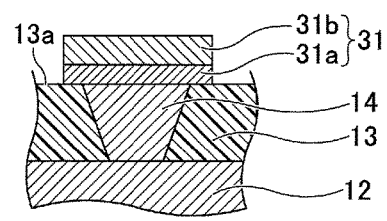

Then, as illustrated in FIG. 5A, after removing the resist layer 310 of FIG. 4C is removed, the electroplating layer 31b is used as a mask to etch (remove) a part of the seed layer 31a that is not covered by the electroplating layer 31b. Thereby, the wiring layer 31 having the electroplating layer 31b layered on the seed layer 31a is formed. The upper surface of the wiring layer 14 is bonded to the electroplating layer 31b of the wiring layer 31 by way of the seed layer 31a of the wiring layer 31. The thickness of the wiring layer 31 (total thickness of the seed layer 31a and the electroplating layer 31b) may be, for example, approximately 1 μm to 3 μm. The line/space of the wiring layer 31 may be, for example, approximately 2 μm/2 μm. FIG. 5B is an enlarged view of part A of FIG. 5A.

Before forming the seed layer 31a, a plasma process such as $O_2$ plasma ashing may be performed on the upper surface 13a of the insulating layer 13. By performing the plasma process, the upper surface 13a of the insulating layer 13 can be roughened. By roughening the upper surface 13a of the insulating layer 13, the adhesiveness between the insulating layer 13 and the seed layer 31a can be increased. However, because a fine wiring can be formed by increasing the flatness of the insulating layer 13 by reducing the roughness of the upper surface 13a of the insulating layer 13, the upper surface 13a of the insulating layer 13 is to be roughened to the extent that the forming of the fine wiring is not adversely affected in a subsequent process.

Figure 5C:
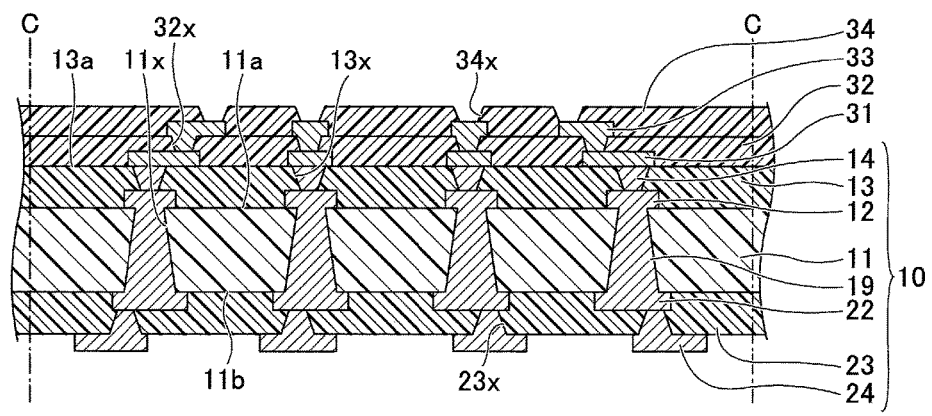

Then, in the process illustrated in FIG. 5C, the insulating layer 32, the wiring layer 33, and the insulating layer 34 are layered on the wiring layer 31. For the sake of convenience, the layered structure of the wiring 31 including the seed layer 31a and the electroplating layer 31b is not illustrated in 5C to 7B.

More specifically, first, the insulating layer 32 is formed on the upper surface 13a of the insulating layer 13 of the first wiring member 10 to cover the wiring layer 31. Then, the via hole 32x that penetrates the insulating layer 32 and exposes the upper surface of the wiring layer 31 is formed in the insulating layer 32. For example, a photosensitive insulating resin having a phenol type resin or polyimide type resin as a main component may be used as the material of the insulating layer 32. The thickness of the insulating layer 32 may be, for example, approximately 5 μm to 10 μm.

The insulating layer 32 may be formed by, for example, applying a liquid or paste-like insulating resin on the upper surface 13a of the insulating layer 13 to cover the wiring layer 31. The liquid or paste-like insulating resin may be applied by using, for example, a spin-coating method. The via hole 32x may be formed by using, for example, a photolithography method. That is, the via hole 32x may be formed by exposing and developing the insulating layer 32 having a photosensitive insulating resin as a main component and then curing the photosensitive insulating layer.

Then, the wiring layer 33 is formed on the insulating layer 32 by using, for example, a semi-additive method. Then, in a similar manner as described above, the insulating layer 34 is formed on the wiring layer 33. Then, the via hole 34x that penetrates the insulating layer 34 and exposes the upper surface of the wiring layer 33 is formed in the insulating layer 34. Details such as the material, the thickness, and the diameter (dimension) of each of the layers have been described above in the description of the wiring substrate 1.

In a case of forming the wiring layer 33 by using the semi-additive method, a seed layer that covers the inner wall surface of the via hole 32x, the upper surface of the wiring layer 31 exposed in the bottom part of the via hole 32x, and the upper surface of the insulating layer 32 is formed in a similar manner as forming the seed layer 31a. Then, the resist layer including an opening corresponding to the wiring layer 33 is formed on the seed layer. Then, the electroplating layer is formed on the seed layer exposed in the opening of the resist layer by an electroplating method using the seed layer as a feed layer. Then, the wiring layer 33 is formed by removing the resist layer and the seed layer exposed from the electroplating layer.

Figure 6A:
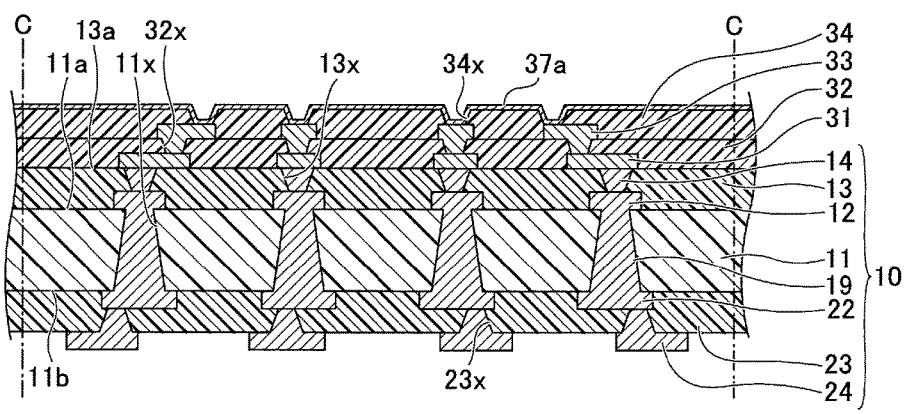

Then, in the process illustrated in FIG. 6A, the seed layer 37a that consecutively covers the upper surface of the wiring layer 33 exposed in the bottom part of the via hole 34x, the inner wall surface of the via hole 34x, and the upper surface of the insulating layer 34 is formed by using, for example, an electroless plating method or a sputtering method. Details such as material, the layer structure, and thickness of the seed layer 37a may be, for example, the same as those of the seed layer 31a.

Figure 6B:
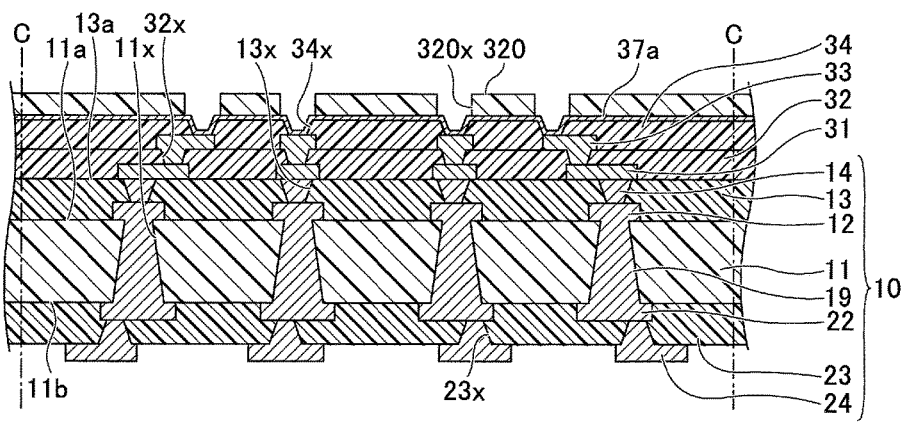

Then, in the process illustrated in FIG. 6B, the resist layer 320 including the opening 320x corresponding to the wiring layer 37 is formed on the seed layer 37a formed on the upper surface of the insulating layer 34. Then, in the process illustrated in FIG. 6C, the electroplating layer 37b made of copper (Cu) or the like is formed in the opening 320x of the resist layer 320 by an electroplating method using the seed layer 37a as a power-feeding layer.

Figure 6C:
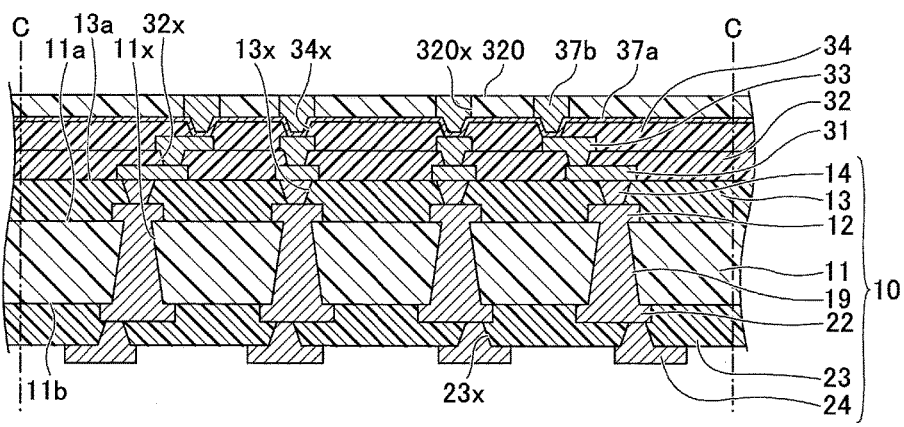
Figure 7A:
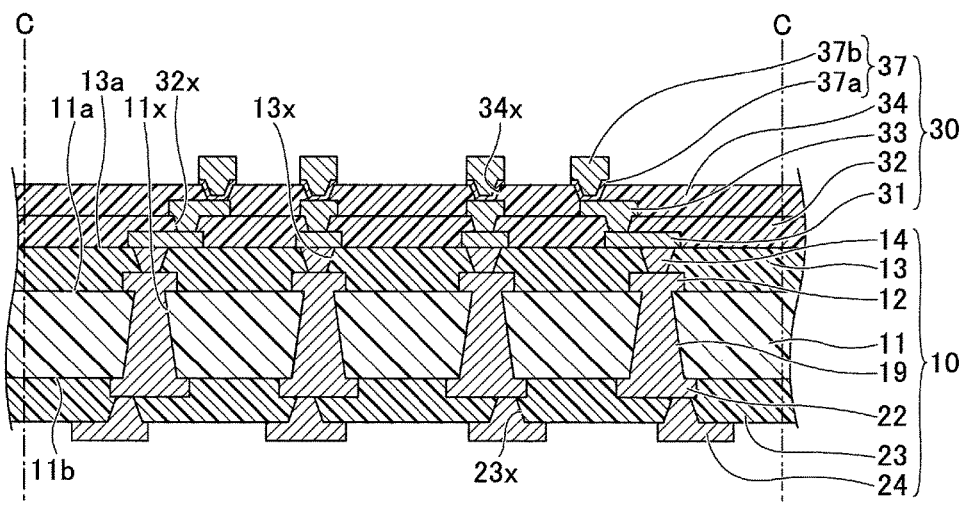

Then, in the process illustrated in FIG. 7A, after the resist layer 320 of FIG. 6C is removed, the electroplating layer 37b is used as a mask to etch (remove) a part of the seed layer 37a that is not covered by the electroplating layer 37b. Thereby, the wiring layer 37 having the electroplating layer 37b layered on the seed layer 37a is formed. The plan-view shape of the pad of the wiring layer 37 may be, for example, a circular shape having a diameter of, for example, 20 μm to 30 μm. Then, a surface processed layer may be formed on the surface (upper surface only or upper and side surfaces) of the pad of the wiring layer 37. By performing the above-described processes, the manufacturing of the second wiring member 30 is completed.

Figure 7B:
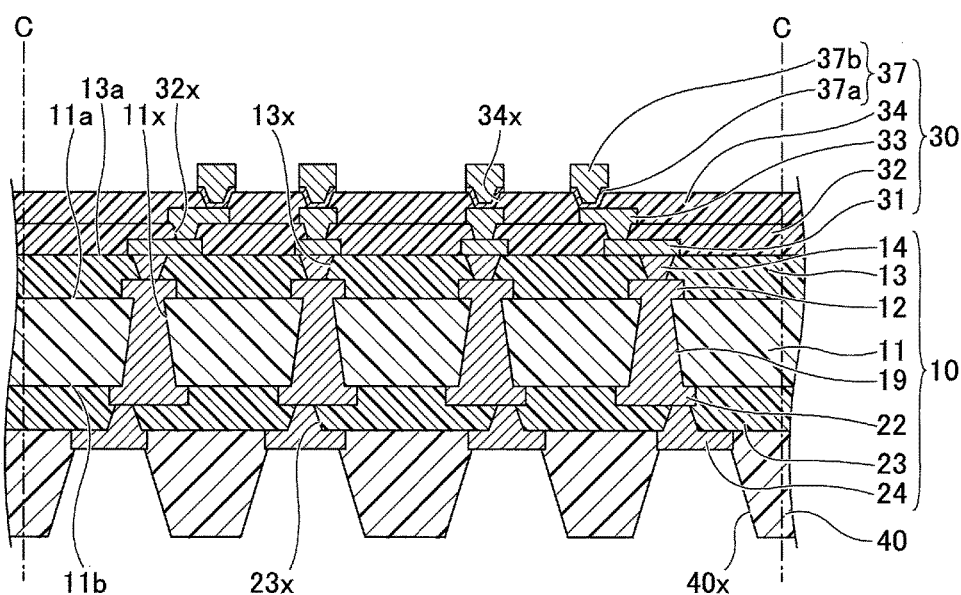

Then, in the process illustrated in FIG. 7B, the solder resist layer 40 that is the outermost layer is formed on the other surface of the insulating layer 23 of the first wiring member 10 to cover the wiring layer 24 of the first wiring member 10. The solder resist layer 40 may be formed by, for example, using the same method for forming the insulating layers 32, 34 illustrated in FIG. 5C.

Then, the opening 40x is formed by, for example, using the same method for forming the via hole 34x illustrated in FIG. 5C. A part of the wiring layer 24 of the first wiring member 10 is exposed in the bottom part of the opening 40x. The wiring layer 24 exposed in the bottom part of the opening 40x may function as a pad to be connected to a mounting substrate such as a motherboard. The above-described surface processed layer may be formed on the lower surface of the wiring layer 24 exposed in the bottom part of the opening 40x. The solder resist layer 40 may be formed at any timing as long as the solder resist layer 40 is formed after the process illustrated in FIG. 3C.

After the process illustrated in FIG. 7B, the structure body illustrated in FIG. 7B is cut by using a slicer or the like at a cutting area C. Thereby, the manufacturing of multiple individualized wiring substrates 1 (see FIG. 1) is completed.

Because the insulating layer 13 of the first wiring member 10 includes a non-photosensitive resin (non-photosensitive thermosetting resin) as a main component, the layer thickness of the wiring substrate 1 can be greater compared to a case of using a photosensitive resin as a main component of the insulating layer 13. Therefore, it becomes easier for the irregularities of the one surface 11a of the core layer 11 to be absorbed and the upper surface 13a of the insulating layer 13 to be flattened.

Further, by polishing the upper surface 13a of the insulating layer 13, the roughness of the upper surface 13a of the insulating layer 13 can be reduced to have an average roughness (Ra) of, for example, approximately 15 nm to 40 nm, so that the flatness of the upper surface 13a of the insulating layer 13 is improved. Thereby, a high density wiring layer (wiring pattern) 31 having a line/space of, for example, approximately 2 μm/2 μm can be formed. That is, high densification of the wiring layer 31 can be achieved.

Further, the through-wiring 19 can have, for example, a circular truncated cone shape in which an area of the end surface (upper end surface) of the through-wiring 19 on the side of the one surface 11a of the core layer 11 for forming the high density wiring layer 31 is smaller than an area of the end surface (lower end surface) of the through-wiring 19 on the side of the other surface 11b of the core layer 11. Thereby, the force that is caused by the difference of the thermal expansion coefficients between the core layer 11 and the through-wiring 19 during the heating process can be directed (escape) to a direction in which the through-wiring 19 projects to the side of the other surface 11b of the core layer 11, so that the force that causes the through-wiring 19 to project to the side of the one surface 11a of the core layer 11 can be reduced. As a result, the thermal history of the heating process can prevent the upper end surface of the through-wiring 19 to project to the side of the one surface 11a of the core layer 11. Accordingly, the flatness of the upper surface 13a of the insulating layer 13 can be ensured.

<Modified Example of First Embodiment>

In the modified example of the first embodiment, the shapes of the through-hole and the through-wiring that penetrate the core layer are different from those of the first embodiment. In the modified example of the first embodiment, further description of like components/parts of the first embodiment may be omitted.

Figure 8A:
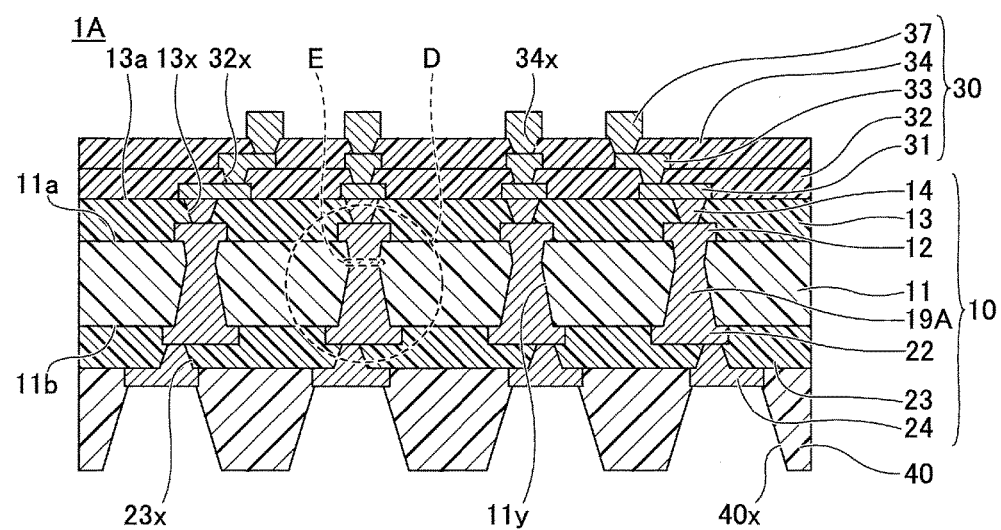
FIGS. 8A and 8B are cross-sectional views illustrating a wiring substrate of a modified example of the first embodiment of the present invention.
Figure 8B:
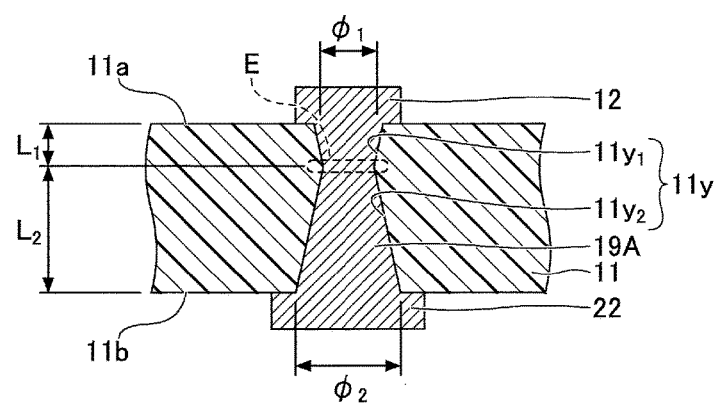

FIGS. 8A and 8B are cross-sectional views of a wiring substrate 1A according to the modified example of the first embodiment. FIG. 8B is an enlarged view of part D of FIG. 8A. With reference to FIGS. 8A and 8B, the wiring substrate 1A of the modified example of the first embodiment is different from the wiring substrate 1 (see FIGS. 1A and 1B) in that the through-hole 11x and the through-wiring 19 are replaced with a through-hole 11y and a through-wiring 19A.

Similar to the through-hole 11x, the through-hole 11y is a hole in which an upper opening on the side of the one surface 11a of the core layer 11 has an area smaller than an area of a lower opening on the side of the other surface 11b of the core layer 11. However, unlike the through-hole 11x, the through-hole 11y includes a constriction part E having a horizontal cross section that is smaller than an area of an upper opening of the through-hole 11y and an area of a lower opening of the through-hole 11y inside the core layer 11.

The plan-view shapes of the upper and lower openings of the through-hole 11y and the constriction part E of the through-hole 11y may be, for example, circular shapes. In this case, the through-hole 11y has an hourglass shape including an inverted circular truncated cone-shaped hole $11y_1$ whose diameter gradually becomes smaller from the upper opening to the constriction part E and a circular truncated cone-shaped hole $11y_2$ whose diameter gradually becomes smaller from the lower opening to the constriction part E. However, the vertical cross sections of the inner walls of the inverted circular truncated cone-shaped hole and the circular truncated cone-shaped hole $11y_2$ are not limited to straight linear shapes but may also be curved linear shapes. From the aspect of reducing stress, the vertical cross sections of the inner walls of the inverted circular truncated cone-shaped hole $11y_1$ and the circular truncated cone-shaped hole $11y_2$ are preferred to be curved linear shapes because stress can be prevented from concentrating at a particular portion.

The constriction part E is formed to be closer to the side of the upper opening of the through-hole 11y than the side of the lower opening of the through-hole 11y with respect to the thickness direction of the core layer 11. That is, in FIG. 8B, the constriction part E is formed to be in a position satisfying a relationship $L_1 < L_2$. For example, although the constriction part E may be formed to be in a position satisfying a relationship of approximately $L_1 = \frac{1}{3}L_2$, the smaller the value of $L_1$ (more closer to zero) the force that is generated in the through-wiring 19A during the heating process can be directed more to a direction in which the through-wiring 19 projects to the side of the other surface 11b of the core layer 11. Therefore, the value of $L_1$ is preferred to be small.

The through-wiring 19A is filled in the through-hole 11y. For example, copper (Cu) may be used as the material of the through-wiring 19A. The through-wiring 19A has a shape corresponding to the shape of the through-hole 11y. That is, the through-wiring 19A has a shape in which the area of the upper end surface is smaller than the lower end surface. Further, the through-wiring 19A includes a constriction part E having a horizontal cross section that is smaller than the area of the upper end surface and the area of the lower end surface. The constriction part E is formed closer to the upper end surface than the lower end surface with respect to the thickness direction of the core layer 11.

The plan-view shapes of the upper and lower end surfaces of the through-wiring 19 and the constriction part E of the through-wiring 19 may be circular shapes. In this case, the diameter $\phi_1$ of the upper end surface of the through-wiring 19A may be, for example, approximately 100 μm to 120 μm. Further, the diameter $\phi_2$ of the lower end surface of the through-hole 19A may be, for example, approximately 130 μm to 150 μm. Further, the diameter of the constriction part E of the through-wiring 19A may be, for example, approximately 80 μm to 100 μm. The pitch between the through-wirings 19A may be, for example, approximately 200 μm to 400 μm.

Figure 9:
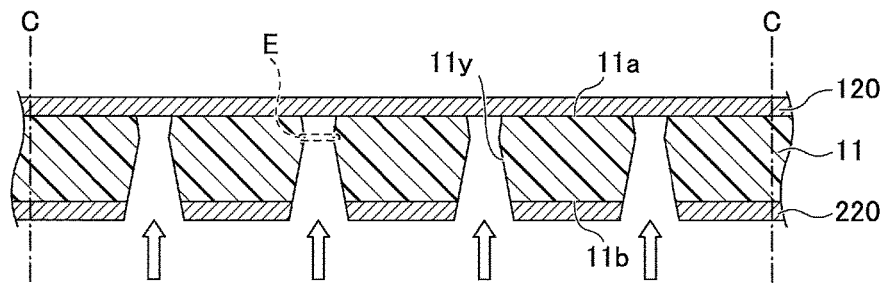
FIGS. 9-10B are schematic diagrams illustrating processes for manufacturing a wiring substrate of a modified example of the first embodiment of the present invention.

Next, a method for manufacturing the wiring substrate according to a modified example of the first embodiment is described. FIG. 9 is a schematic diagram illustrating a process for manufacturing the wiring substrate according to the modified example of the first embodiment. In the processes of the below-described modified example, multiples wiring substrates are manufactured by fabricating multiple parts that are to become wiring substrates and be individualized into separate pieces. However, the processes of the below-described modified example may be applied to manufacturing a single wiring substrate.

In the process illustrated in FIG. 9, a substrate having a flat sheet metal foil 120 layered on the one surface 11a of the core layer 11 and a flat sheet metal foil 220 layered on the other surface 11b of the core layer 11 is prepared. Multiple through-holes 11y are formed in the substrate. Similar to the process illustrated in FIG. 2A, the through-hole 11y is formed by radiating a laser (e.g., $Co_2$ laser) from the side of the other surface 11b of the core layer 11 by way of the metal foil 220. Thereby, the through-hole 11y that exposes the lower surface of the metal foil 120 is formed.

However, unlike the process illustrated in FIG. 2A, the through-hole 11y is formed into a shape illustrated in FIG. 9 by adjusting the radiation conditions (e.g., increasing the power of the radiated laser). In the state where the power of the radiated power is increased, the radiated laser heats the metal foil 120, so that the heated metal foil 120 causes the resin of the core layer 11 to be heated and melted, in which more resin is heated the closer to the metal foil 120.

After the process of FIG. 9, the wiring substrate 1A of FIGS. 8A and 8B is formed by performing similar processes illustrated in FIGS. 2B to 7B of the first embodiment.

Figure 10A:
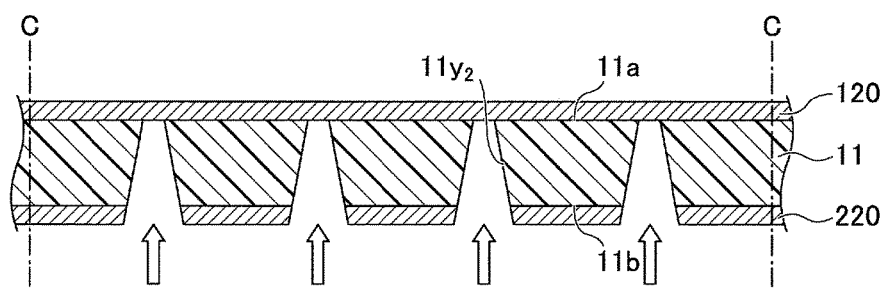
Figure 10B:
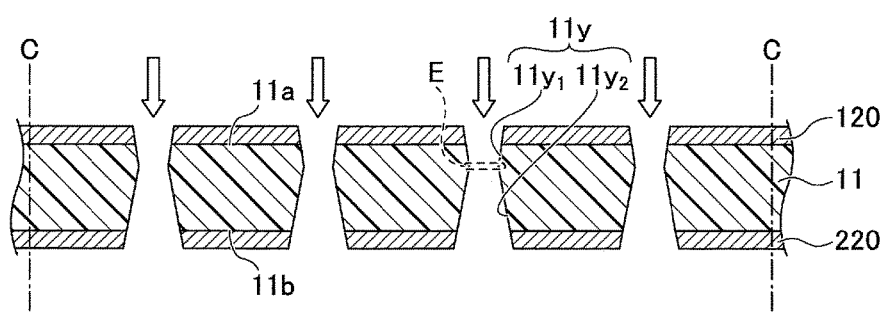

Instead of performing the process illustrated in FIG. 9, the through-hole 11y may be formed by the processes illustrated in FIGS. 10A and 10B.

First, in the process illustrated in FIG. 10A, a substrate having a flat sheet metal foil 120 layered on the one surface 11a of the core layer 11 and a flat sheet metal foil 220 layered on the other surface 11b of the core layer 11 is prepared. Multiple holes $11y_2$ are formed in the substrate. Similar to the process illustrated in FIG. 2A, the hole $11y_2$ is formed by radiating a laser (e.g., $Co_2$ laser) from the side of the other surface 11b of the core layer 11 by way of the metal foil 220. The hole $11y_2$ does not need to penetrate the core layer 11 as long as the upper end of the hole $11y_2$ is positioned more toward the side of the one surface 11a of the core layer 11 than an area where the constriction part E is to be formed in the following process illustrated in FIG. 10B.

Then, in the process illustrated in FIG. 10B, multiple holes $11y_1$ are formed by radiating a laser (e.g., $Co_2$ laser) from the side of the one surface 11a of the core layer 11 by way of the metal foil 120. Each hole is formed to communicate with a corresponding hole $11y_2$ and form the through-hole 11y including the constriction part E.

By adjusting the radiation time and power of the laser radiated from the side of the one surface 11a of the core layer 11 and the side of the other surface 11b of the core layer 11, the upper opening of the through-hole 11y can be formed to have an area smaller than an area of the lower opening of the through-hole 11y, and the constriction part E can be formed in a position closer to the upper opening of the through-hole 11y than the lower opening of the through-hole 11y.

In the state where the power of the radiated power is increased, the radiated laser heats the metal foil 120, so that the heated metal foil 120 causes the resin of the core layer 11 to be heated and melted, in which more resin is heated the closer to the metal foil 120. It is preferable to adjust the radiation time and power of the laser radiated from the side of the one surface 11a of the core layer 11 and the side of the other surface 11b of the core layer 11, so that the constriction part E is formed in a position satisfying a relationship of approximately $L_1 = \frac{1}{3}L_2$ of FIG. 8B.

The method illustrated with FIGS. 10A and 10B is advantageous in a case where the core layer 11 has a thickness that makes it difficult to form a through-hole 11 by radiating a laser only from one side of the core layer 11. More specifically, the method illustrated with FIGS. 10 and 10B is advantageous when the thickness of the core layer 11 is, for example, approximately greater than or equal to 200 μm.

With the above-described modified example of the first embodiment, the through-wiring 19A can be formed into a shape (hourglass shape) that includes an upper end surface (high density wiring side) having an area smaller than an area of a lower end surface and a constriction part E having a horizontal cross section that is smaller than the area of the upper end surface and the area of the lower end surface. The constriction part E is formed closer to the upper end surface of the through-hole 19A than the lower end surface of the through-hole 19A.

Thereby, the volume of a part of the through-wiring 19A positioned more closer to the lower end surface than the constriction part E becomes greater than the volume of a part of the through-wiring 19A positioned more closer to the upper end surface than the constriction part E. Therefore, the force that is caused by the difference of the thermal expansion coefficients between the core layer 11 and the through-wiring 19A during the heating process can be directed to a direction in which the through-wiring 19A projects to the side of the other surface 11b of the core layer 11, so that the force that causes the through-wiring 19A to project to the side of the one surface 11a of the core layer 11 can be reduced. As a result, the upper end surface of the through-wiring 19A can be prevented from projecting to the side of the one surface 11a of the core layer 11. Accordingly, the flatness of the upper surface 13a of the insulating layer 13 can be ensured. Other effects attained by the modified example of the first embodiment are the same as those of the first embodiment.

The more the constriction part E is positioned closer to the upper end surface of the through-wiring 19A than the lower end surface of the through-wiring 19A, the volume of the part of the through-hole 19A positioned more closer to the lower end surface than the constriction part E becomes greater than the volume of the part of the through-hole 19A positioned more closer to the upper end surface than the constriction part E. Therefore, the force that is generated in the through-wiring 19A during the heating process can be directed more to a direction in which the through-wiring 19A projects to the side of the other surface 11b of the core layer 11. As long as the constriction part E is positioned more closer to the upper end surface of the through-wiring 19A than the lower end surface of the through-wiring 19A (positioned more closer to the upper end surface than ½ position with respect to the thickness of the core layer 11), the effect of preventing the upper end surface of the through-wiring 19A from projecting to the side of the one surface 11a of the core layer 11 can be attained to some degree.

<Second Embodiment>

In the second embodiment of the present invention, plain layers are formed on the wiring layers formed on the one and the other surfaces of the core layer. In the second embodiment, further description of like components/parts of the first embodiment may be omitted.

Figure 11A:
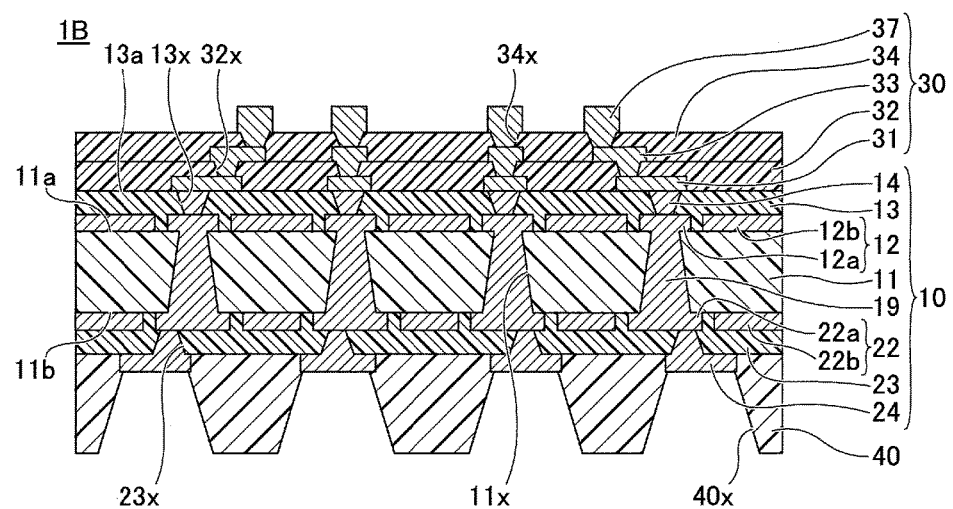
FIGS. 11A and 11B are schematic diagrams illustrating a wiring substrate according to a second embodiment of the present invention.
Figure 11B:
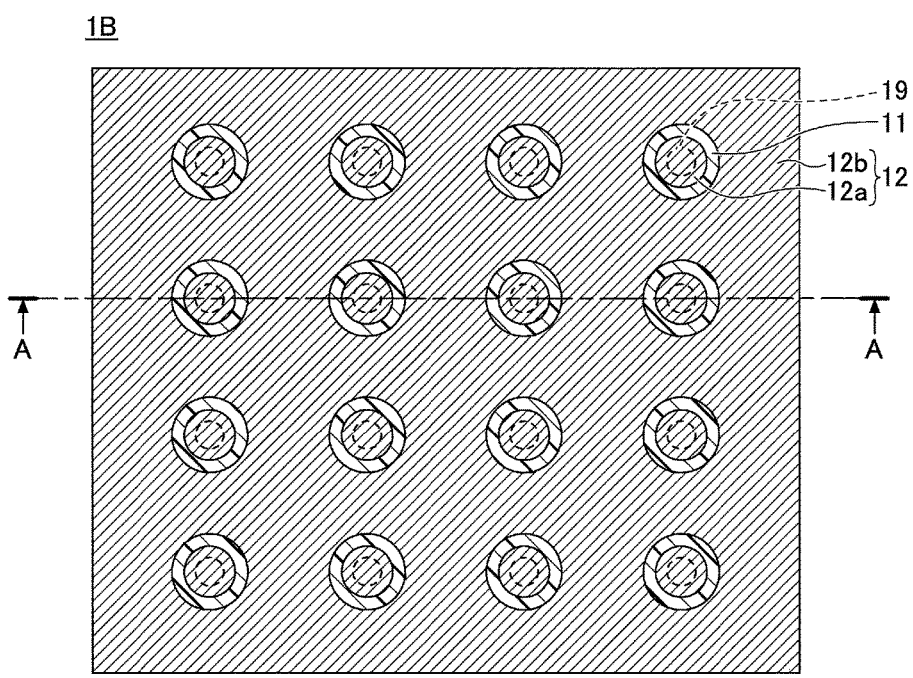

FIGS. 11A and 11B are schematic diagrams illustrating a wiring substrate 1B according to the second embodiment of the present invention. FIG. 11B is a plan view, and FIG. 11A is a cross-sectional view taken along line A-A of FIG. 11B. However, the layers above the wiring layer 12 are not illustrated in FIG. 11B. For the sake of convenience, the plan view of FIG. 11B is illustrated with hatchings corresponding to the cross-sectional view of FIG. 11A.

The wiring substrate 1B has a wiring layer 12 formed on the one surface 11a of the core layer 11. The wiring layer 12 includes a pad 12a and a plane layer 12b. The plane layer 12b is provided at a predetermined interval (e.g., approximately 20 μm) in the periphery of the pad 12a. The pad 12a and the plane layer 12b are not conducted with each other. A wiring layer 22 is formed on the other surface 11b of the core layer 11. The wiring layer 22 includes a pad 22a and a plane layer 22b. The plane layer 22b is provided at a predetermined interval (e.g., approximately 20 μm) in the periphery of the pad 22a. The pad 22a and the plane layer 22b are not conducted with each other.

The pad 12a and the pad 22a are electrically connected to each other by way of the through-wiring 19 that penetrates the core layer 11. The pad 12a has a smaller diameter than the pad 22a in correspondence with the diameters of the upper and lower end surfaces of the through-wiring 19. The pad 12a and the pad 22a may be, for example, positioned to be superposed with each other from a plan view. The plane layer 12b and the plane layer 22b may be, for example, positioned to be superposed with each other from a plan view. For example, copper (Cu) may be used as the materials of the wiring layers 12, 22. The thickness of the wiring layer 12 and 22 may be, for example, approximately 15 μm to 35 μm, respectively.

The term "plane layer" refers to a layer provided entirely on a predetermined surface except for a signal wiring region in which a signal wiring (e.g., pad 12a) is provided. The proportion of the area of the signal wiring region with respect to the area of the predetermined surface is different depending on the type of wiring substrate. Therefore, the proportion of the area of the plane layer with respect to the area of the predetermined surface is also different depending on the type of wiring substrate. The proportion of the area of the plane layer with respect to the area of the predetermined surface is not limited in particular but may be, for example, approximately 20% to 60%.

In this embodiment, the plane layer 12b is provided for facilitating the flattening of the upper surface 13a of the insulating layer 13 formed on the wiring layer 12. Therefore, whether the proportion of the area of the plane layer 12b with respect to the area of the one surface 11a of the core layer 11 is large or small is not a significant problem. However, it is preferable for the proportion of the total area of the pad 12a and the plane layer 12b with respect to the area of the one surface 11a of the core layer 11 to be large. The proportion of the total area of the pad 12a and the plane layer 12b (copper remaining ratio in a case where the material of the wiring layer 12 is copper) with respect to the area of the one surface 11a of the core layer 11 is preferably approximately 70% to 90%, and more preferably greater than or equal to 80%. The plane layer 12b and the plane layer 22b may be multiple regions that are independent from each other.

Accordingly, in the wiring substrate 1B, a wide area plane layer 12b is formed in the periphery of the pad 12a on the one surface 11a of the core layer 11, and the proportion of the total area of the pad 12a and the plane layer 12b with respect to the area of the one surface 11a of the core layer 11 is large. Therefore, the part for forming the insulating layer 13 can have less irregularities formed by the wiring layer 12 and the one surface 11a of the core layer 11. Thus, compared to a case of forming only the pad and wiring pattern on the one surface 11a of the core layer 11 with many irregularities formed on the part for forming the insulating layer 13, the flattening of the upper surface 13a of the insulating layer 13 is facilitated.

Further, by polishing the upper surface 13a of the insulating layer 13, the roughness of the upper surface 13a of the insulating layer 13 can be reduced to an average roughness of, for example, approximately 15 nm to 40 nm, so that the flatness of the insulating layer 13 is improved. Therefore, a high density wiring pattern having a line/space of, for example, approximately 2 μm/2 μm can be formed on the upper surface 13a of the insulating layer 13. That is, high densification of the wiring layer can be achieved.

Apart of the pad 12a, 22a may be conducted with the plane layer 12b, 22b. In this case, if the plane layer 12b, 22b is ground (GND) or power supply potential, the part of the pad 12a, 22a is also fixed to ground (GND) or power supply potential. Thereby, the pad 12a, 22a that is to be a signal wiring can attain a shielding (blocking) effect against noise from outside.

Further, in a case where the adhesiveness between the plane layer 12b and the insulating layer 12 is desired to be improved, the plane layer 12b may be formed to have a mesh shape or formed to have a through-hole. Similarly, in a case where the adhesiveness between the plane layer 22b and the insulating layer 23 is desired to be improved, the plane layer 22b may be formed to have a mesh shape or formed to have a through-hole. However, the plane layers 12b, 22b are to be formed to have a fine mesh shape or through-hole, so that the flattening of the upper surface 13a of the insulating layer 13 is not adversely affected by the mesh shape and through-hole.

Further, the plane layer does not necessarily need to be formed on the side of the other surface 11b of the core layer 11 where the high density wiring layer is not formed.

<Third Embodiment>

In the third embodiment of the present invention, multiple insulating layers and wiring layers constituting the first wiring member 10 are formed on each of the one and the other surfaces of the core layer. In the third embodiment, further description of like components/parts of the first and second embodiments may be omitted.

Figure 12:
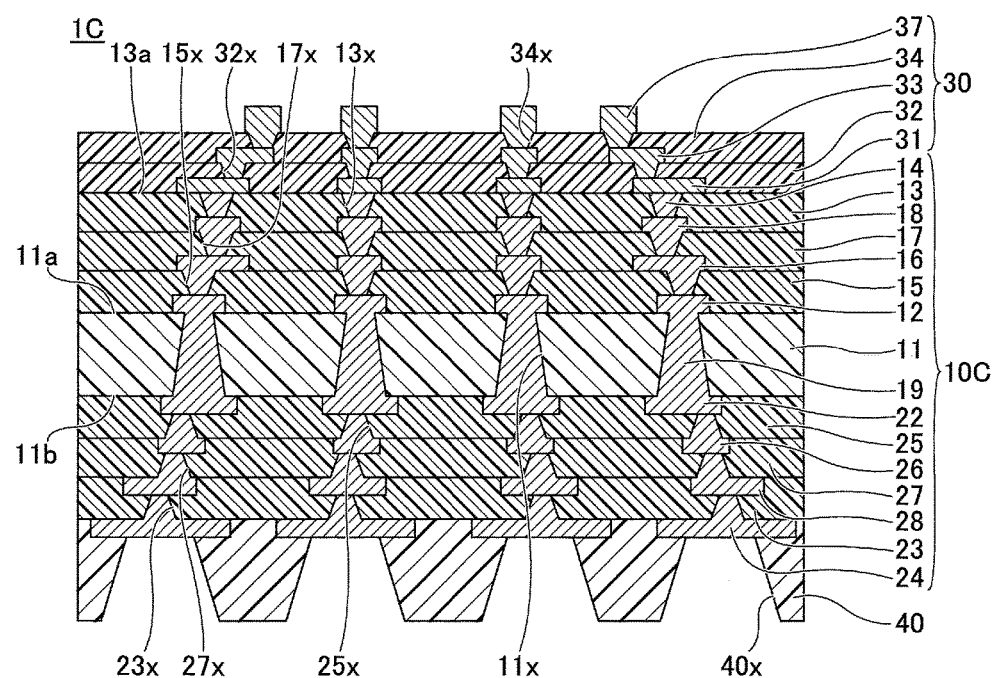
FIG. 12 is a cross-sectional view illustrating a wiring substrate according to a third embodiment of the present invention.

FIG. 12 is a cross-sectional view illustrating a wiring substrate 10 according to the third embodiment of the present invention. The wiring substrate 10 of the third embodiment is different from the wiring substrate 1 (see FIGS. 1A and 1B) in that the first wiring member 10 is replaced with a first wiring member 100.

The first wiring member 100 is different from the first wiring member 10 in that a layered body including an insulating layer 15, a wiring layer 16, an insulating layer 17, and a wiring layer 18 is added between the one surface 11a of the core layer 11 and the insulating layer 13. Further, the first wiring member 100 is different from the first wiring member 10 in that a layered body including an insulating layer 25, a wiring layer 26, an insulating layer 27, and a wiring layer 28 is added between the other surface 11b of the core layer 11 and the insulating layer 23.

That is, the first wiring member 100 has multiple wiring layers (wiring layers 12, 16, 18, 14) and multiple insulating layers made of non-photosensitive resin (insulating layers 15, 17, 13) alternately layered on the one surface 11a of the core layer 11. This layered body may also be referred to as a first layered body. The wiring layer 12 is the lowermost wiring layer among the wiring layers of the first layered body on the side of the one surface 11a of the core layer 11. The insulating layer 13 is the uppermost layer among the insulating layers of the first layered body on the side of the one surface 11a of the core layer 11.

Further, the first wiring member 100 has multiple wiring layers (wiring layers 22, 26, 28, 24) and multiple insulating layers made of non-photosensitive resin (insulating layers 25, 27, 23) alternately layered on the other surface 11b of the core layer 11. This layered body may also be referred to as a second layered body. The wiring layer 22 is the lowermost wiring layer among the wiring layers of the second layered body on the side of the other surface 11b of the core layer 11. The insulating layer 23 is the uppermost layer among the insulating layers of the second layered body on the side of the other surface 11b of the core layer 11.

In the first and second layered bodies of this embodiment, a layer positioned close to the core layer 11 is referred to as a lower layer, and a layer positioned far from the core layer 11 is referred to as an upper layer. The wiring substrate 10 of the second embodiment is described in further detail below.

The insulating layer 15 is formed on the one surface 11a of the core layer 11 to cover the wiring layer 12. Similar to the insulating layer 13, the material of the insulating layer 15 may be, for example, a non-photosensitive insulating resin (e.g., thermosetting resin) having an epoxy type resin as a main component. The thickness of the insulating layer 15 is, for example, approximately 40 μm to 75 μm. The insulating layer 15 may include a filler such as silica ($SiO_2$).

The wiring layer 16 is formed on the one side of the insulating layer 15 and is electrically connected to the wiring layer 12. The wiring layer 16 includes a via wiring that fills a via hole 15x that penetrates the insulating layer 15 and exposes the one surface of the wiring layer 12. The wiring layer 16 also includes a wiring pattern formed on the one surface of the insulating layer 15. The via hole 15x is an inverted circular truncated cone-shaped recess including an opening on a side of the insulating layer 17 and a bottom surface formed by an upper surface of the wiring layer 12. The area of the opening on the side of the insulating layer 17 is larger than the area of the bottom surface of the recess. The diameter of the opening of the via hole 15x may be, for example, approximately 50 μm to 70 μm. The material of the wiring layer 16 and the thickness and line/space of the wiring pattern of the wiring layer 16 may be, for example, the same as those of the wiring layer 12.

The insulating layer 17 is formed on the one surface of the insulating layer 15 to cover the wiring layer 16. The material and thickness of the insulating layer 17 may be, for example, the same as those of the insulating layer 15. The insulating layer 17 may include a filler such as silica ($SiO_2$).

The wiring layer 18 is formed on the one side of the insulating layer 17 and is electrically connected to the wiring layer 16. The wiring layer 18 includes a via wiring that fills a via hole 17x that penetrates the insulating layer 17 and exposes the one surface of the wiring layer 16. The wiring layer 18 also includes a wiring pattern formed on the one surface of the insulating layer 17. The via hole 17x is an inverted circular truncated cone-shaped recess including an opening on a side of the insulating layer 13 and a bottom surface formed by an upper surface of the wiring layer 16. The area of the opening on the side of the insulating layer 13 is larger than the area of the bottom surface of the recess. The diameter of the opening of the via hole 17x may be, for example, approximately 50 μm to 70 μm. The material of the wiring layer 18 and the thickness and line/space of the wiring pattern of the wiring layer 18 may be, for example, the same as those of the wiring layer 12.

The insulating layer 13 is formed on the one surface of the insulating layer 17 to cover the wiring layer 18. The wiring layer 14 includes a via wiring that fills a via hole 13x that penetrates the insulating layer 13 and exposes the one surface of the wiring layer 18. The wiring layer 14 is electrically connected to the wiring layer 18. Details of the insulating layer 13 and the wiring layer 14 are the same as those described in the first embodiment.

The insulating layer 25 is formed on the other surface 11b of the core layer 11 to cover the wiring layer 22. The material and thickness of the insulating layer 25 may be, for example, the same as those of the insulating layer 15. The insulating layer 25 may include a filler such as silica ($SiO_2$).

The wiring layer 26 is formed on the other side of the insulating layer 25 and is electrically connected to the wiring layer 22. The wiring layer 26 includes a via wiring that fills a via hole 25x that penetrates the insulating layer 25 and exposes the other surface of the wiring layer 22. The wiring layer 26 also includes a wiring pattern formed on the other surface of the insulating layer 25. The via hole 25x is a circular truncated cone-shaped recess including an opening on a side of the insulating layer 27 and a bottom surface formed by a lower surface of the wiring layer 22. The area of the opening on the side of the insulating layer 27 is larger than the area of the bottom surface of the recess. The diameter of the opening of the via hole 25x may be, for example, approximately 50 μm to 70 μm. The material of the wiring layer 26 and the thickness and line/space of the wiring pattern of the wiring layer 26 may be, for example, the same as those of the wiring layer 12.

The insulating layer 27 is formed on the other surface of the insulating layer 25 to cover the wiring layer 26. The material and thickness of the insulating layer 27 may be, for example, the same as those of the insulating layer 15. The insulating layer 27 may include a filler such as silica ($SiO_2$).

The wiring layer 28 is formed on the other side of the insulating layer 27 and is electrically connected to the wiring layer 26. The wiring layer 28 includes a via wiring that fills a via hole 27x that penetrates the insulating layer 27 and exposes the other surface of the wiring layer 26. The wiring layer 28 also includes a wiring pattern formed on the other surface of the insulating layer 27. The via hole 27x is a circular truncated cone-shaped recess including an opening on a side of the insulating layer 23 and a bottom surface formed by a lower surface of the wiring layer 26. The area of the opening on the side of the insulating layer 23 is larger than the area of the bottom surface of the recess. The diameter of the opening of the via hole 27x may be, for example, approximately 50 μm to 70 μm. The material of the wiring layer 28 and the thickness and line/space of the wiring pattern of the wiring layer 28 may be, for example, the same as those of the wiring layer 12.

The insulating layer 23 is formed on the other surface of the insulating layer 27 to cover the wiring layer 28. The wiring layer 24 is formed on the other side of the insulating layer 23. The wiring layer 24 is electrically connected to the wiring layer 28. Details of the insulating layer 23 and the wiring layer 24 are the same as those described in the first embodiment.

The thicknesses of the insulating layers 15, 17, 23, 25, and 27 are approximately 3 μm to 5 μm greater than the thickness of the insulating layer 13. This is because the upper surfaces of the insulating layers 15, 17 and the lower surfaces of the insulating layers 23, 25, 27 are not polished whereas the upper surface 13a of the insulating layer 13 is polished. That is, although the thicknesses of the insulating layers 13, 15, 17, 23, 25, 27 are substantially the same before being polished, the thickness of the insulating layer 13 becomes approximately 3 μm to 5 μm less than the thickness of the insulating layers 15, 17, 23, 25, 27 by polishing only the upper surface 13a of the insulating layer 13.

In this embodiment, three insulating layers (insulating layers 15, 17, 13) are formed on the side of the one surface 11a of the core layer 11, and three insulating layers (insulating layers 25, 27, 23) are formed on the side of the other surface 11b of the core layer 11. However, the number of insulating layers formed on each side of the core layer 11 may be less or more than 3 layers. In this embodiment, four wiring layers (wiring layers 12, 16, 18, 14) are formed on the side of the one surface 11a of the core layer 11, and four wiring layers (wiring layers 22, 26, 28, 24) are formed on the side of the other surface 11b of the core layer 11. However, the number of wiring layers formed on each side of the core layer 11 may be less or more than four layers.

Accordingly, the same number of insulating layers and wiring layers may be formed on both surfaces of the core layer 11 of the first wiring member 100. That is, the first wiring member 100 may have a layered structure in which the insulating layers and the wiring layers are vertically symmetric to each other with the core layer 11 as their center. Therefore, the first wiring member 100 has a structure that is resistant to warping. Particularly, because the balance between the top and the bottom of the first wiring member 100 is enhanced by forming each of the insulating layers with substantially the same thickness, the structure of the first wiring member 100 is resistant to warping. The aspect of forming a high density wiring layer on the insulating layer 13 is the same as the first embodiment.

<First Applied Example of First Embodiment>

The first applied example of the first embodiment is a semiconductor package 2 having a semiconductor chip (semiconductor device) 71 mounted (flip-chip mounted) on the wiring substrate 1 of the first embodiment. In the first applied example of the first embodiment, further description of like components/parts of the first-third embodiments may be omitted.

Figure 13:
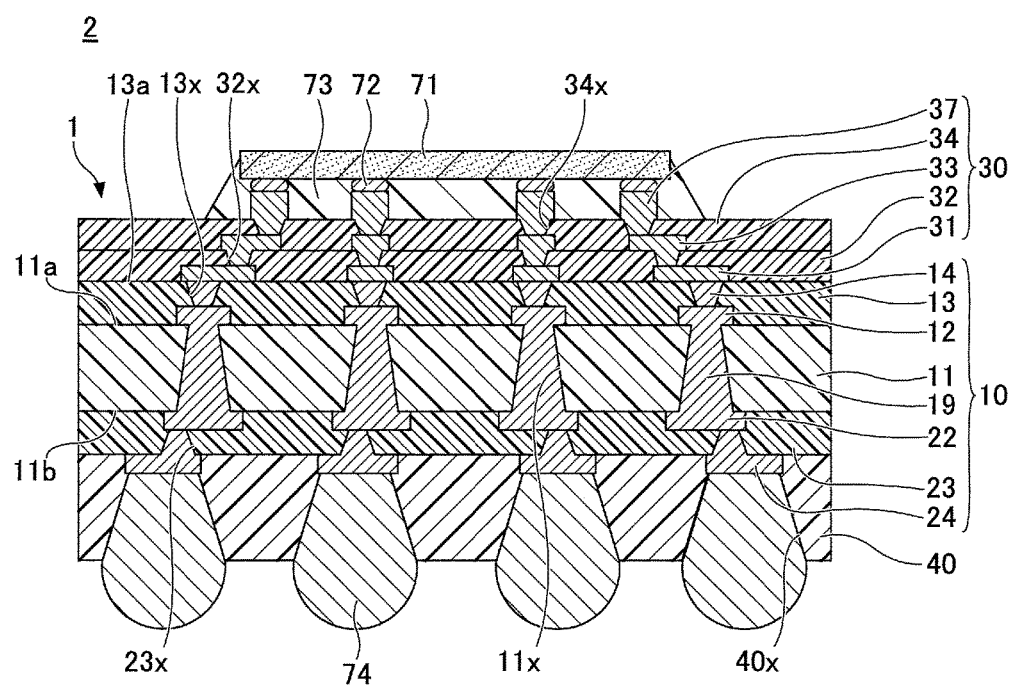
FIG. 13 is a cross-sectional view illustrating a semiconductor package of a first application example of the first embodiment.

FIG. 13 is a cross-sectional view of the semiconductor package 2 according to the first applied example of the first embodiment. With reference to FIG. 13, the semiconductor package 2 includes the wiring substrate 1 of FIGS. 1A and 1B, the semiconductor chip 71, a bump 72, an underfill resin 73, and a bump 74. In the semiconductor package 2, the side of the insulating layer 34 (side of the second insulating layer) of the wiring substrate 1 is a semiconductor device mounting surface on which the semiconductor chip (electronic device) 71 is to be mounted. The side of the solder resist layer 40 of the wiring substrate 1 is an external device mounting surface on which an external connection terminal is to be formed and to which an external device such as a motherboard is connected.

The semiconductor chip 71 includes a semiconductor integrated circuit (not illustrated) or the like that is formed on a thin semiconductor substrate (not illustrated) made of silicon or the like. An electrode pad (not illustrated) that is electrically connected to the semiconductor integrated circuit (not illustrated) is formed on the semiconductor substrate (not illustrated).

The bump 72 electrically connects an electrode pad (not illustrated) of the semiconductor chip 71 and the wiring layer 37 of the wiring substrate 1. The underfill resin 73 is filled between the semiconductor chip 71 and the upper surface of the wiring substrate 1. The bump 74 is an external connection terminal that is formed on the lower surface of the wiring layer 24 that is exposed in the bottom part of the opening 40x of the solder resist layer 40. The bump 74 is connected to an external device such as a motherboard. The bump 72 and the bump 74 may be, for example, solder bumps. For example, an alloy including Pb, an alloy including Sn and Cu, an alloy including Sn and Ag, or an alloy including Sn, Ag, and Cu may be used as the material of the solder bumps.

Because the wiring substrate 1 of the first embodiment includes the second wiring member 30 having a high density wiring layer as described above, a semiconductor chip can be suitably mounted on the wiring substrate 1. By mounting the semiconductor chip on the wiring substrate 1 of the first embodiment, a semiconductor package is obtained.

<Second Applied Example of First Embodiment>

Figure 14:
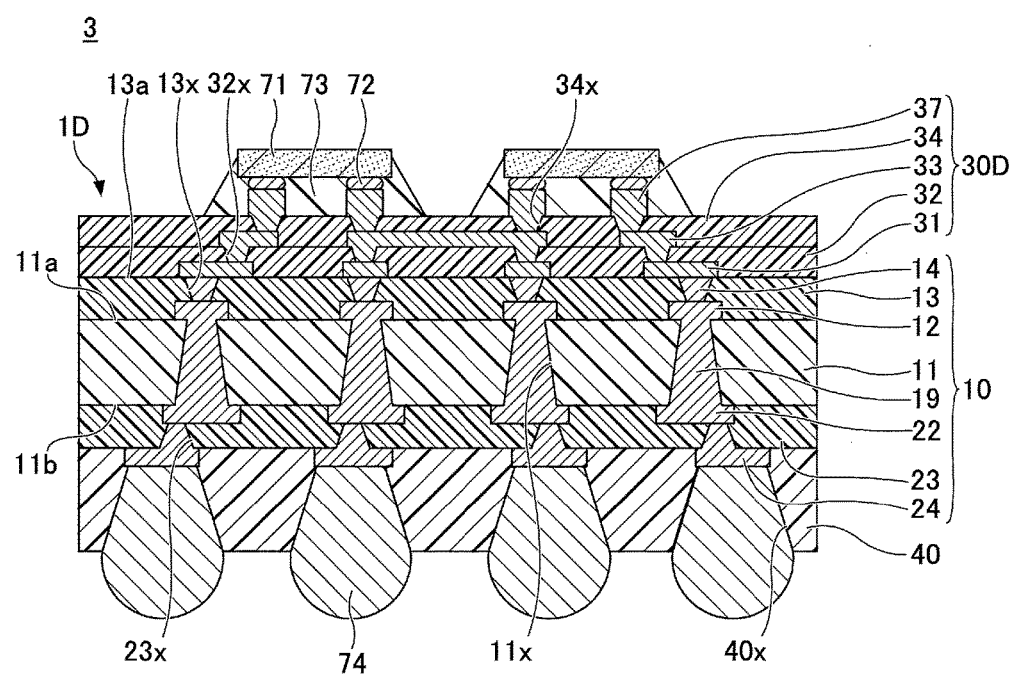
FIG. 14 is a cross-sectional view illustrating a semiconductor package of a second application example of the first embodiment.

A semiconductor package 3 may have multiple semiconductor chips 71 mounted on a wiring substrate 1D as illustrated in FIG. 14. In this case, a logic chip and a memory chip may be combined and mounted on the wiring substrate 1D. Alternatively, a CPU chip and a DRAM chip may be mounted on the wiring substrate 1D, or a GPU chip and a DRAM chip may be mounted on the wiring substrate 1D.

Although the basic structure of the wiring substrate 1D illustrated in FIG. 14 is substantially the same as the basic structure of the wiring substrate 1 illustrated in FIGS. 1A and 1B, the second wiring member 30 is replaced with a second wiring member 30D. The second wiring member 30D is different from the second wiring member 30 in that the wiring layer 33 in the second wiring member 30D includes a wiring that connects the multiple semiconductor chips 71 with each other.

<Third Applied Example of First Embodiment>

Figure 15:
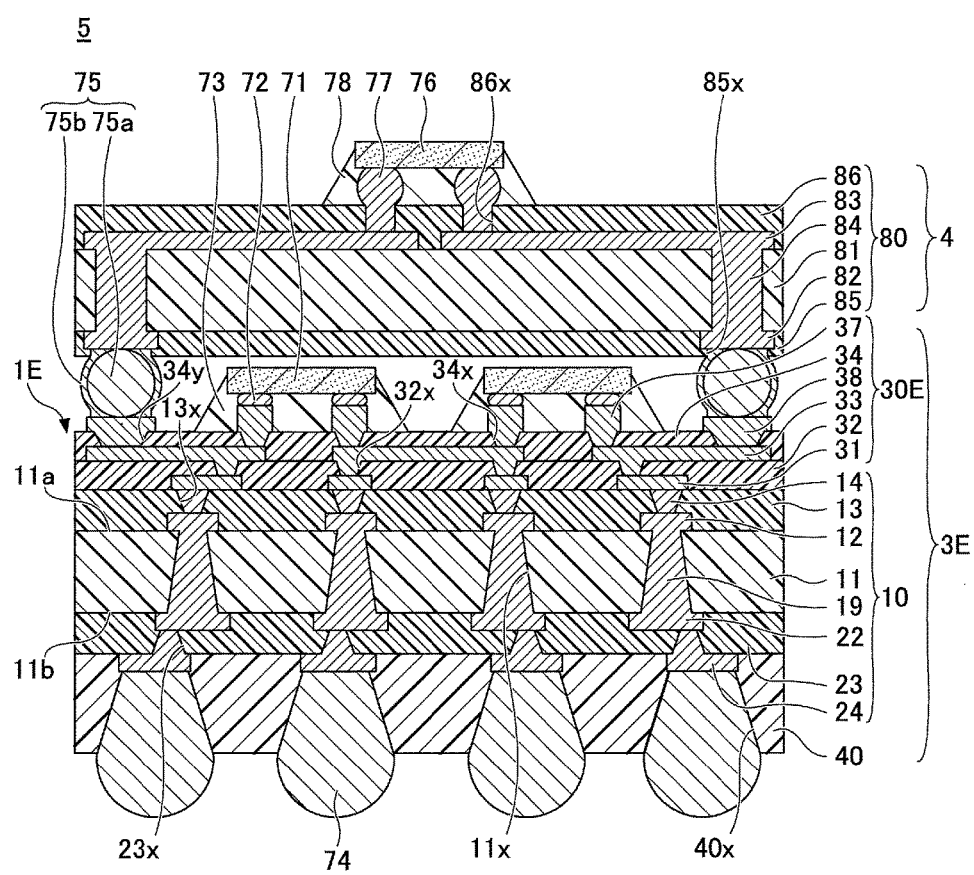
FIGS. 15 and 16 are cross-sectional view illustrating a semiconductor package of a third application example of the first embodiment.

The third applied example of the first embodiment may be a semiconductor package 5 having a POP (Package ON Package) structure in which a semiconductor package 4 is mounted on another semiconductor package 3E as illustrated in FIG. 15.

The semiconductor package 3E includes a wiring substrate 1E and a second wiring member 30E that replaces the wiring substrate 1D and the second wiring member 30D of the semiconductor package 3 illustrated in FIG. 14. The second wiring member 30E is different from the second wiring member 30D (see FIG. 14) in that an opening 34y that selectively exposes the upper surface of the wiring layer 33 is provided in the insulating layer 34 and that a wiring layer 38 is provided to extend from the inside of the opening 34y to the upper surface of the insulating layer 34 in the periphery of the opening 34y. Similar to the second wiring member 30D (see FIG. 14), the wiring layer 33 in the second wiring member 30E includes a wiring that connects the multiple semiconductor chips 71 with each other.

The wiring layer 38 is a pad for connecting the wiring substrate 15 to another wiring substrate or another semiconductor package. For example, the wiring layer 38 may be arranged in the periphery of a region where the semiconductor chip 71 is to be mounted. The plan-view shape of the wiring layer 38 may be, for example, a circular shape having a diameter of approximately 120 μm to 170 μm. The above-described surface processed layer may be formed on the surface of the wiring layer 38 according to necessity.

The semiconductor package 4 includes a wiring substrate 80, a semiconductor chip 76, a bump 77, and an underfill resin 78.

In the wiring substrate 80, the wiring layer 82 is formed on the lower surface of the core layer 81, and a solder resist layer 85 including an opening 85x for selectively exposing the wiring layer 83 as a pad is provided. The wiring layer 82 and the wiring layer 83 are connected by way of a through-wiring 84 that penetrates the core layer 81. According to necessity, the above-described surface processed layer may be formed on the surfaces of the wiring layer 82 exposed in the opening 85x and the wiring layer 83 exposed in the opening 86x. Further, another wiring layer may be provided in the core layer 81.

An electrode pad (not illustrated) of the semiconductor chip 76 is electrically connected to the wiring layer (pad) 83 exposed in the opening 86x of the wiring substrate 80 by way of the bump (e.g., solder bump) 77. The underfill resin 78 is filled between the semiconductor chip 76 and the upper surface of the wiring substrate 80. The semiconductor chip 76 may have the same or different function as the semiconductor chip 71.

The wiring layer (pad) 82 exposed in the opening 85x is arranged to face the wiring layer (pad) 38 of the semiconductor package 3E. The wiring layer (pad) 82 has substantially the same shape as the wiring layer (pad) 38. The wiring layer (pad) 82 and the wiring layer (pad) 38 are connected by way of a solder ball 75. The solder ball 75 has a structure in which the periphery of a copper core ball 75a is covered by solder 75b. Alternatively, a copper pillar may be used instead of the copper core ball 75a.

The solder ball 75 functions as a bonding material for connecting (bonding) the semiconductor package 3E and the semiconductor package 4 to each other. In addition, the solder ball 75 functions as a spacer for maintaining a distance (separation distance) of a predetermined value between the semiconductor package 3E and the semiconductor package 4. That is, the solder 75b functions as a bonding material, and the copper core ball 75a functions as a spacer. The height of the solder ball 75 is set to be greater than a total of the thickness of the semiconductor chip 71, the thickness of the bump 72, and the thickness of the projecting part of the wiring layer 37 from the wiring substrate 1E.

An encapsulating resin may be filled between a space between the semiconductor package 3E and the semiconductor package 4. By filling the encapsulating resin between the space, the semiconductor package 3E can be fixed to the semiconductor package 4, and the semiconductor chip 71 that is mounted on the wiring substrate 1E can be encapsulated. That is, the encapsulating resin functions as an adhesive agent for adhering the semiconductor package 3E and the semiconductor package 4 along with functioning as a protective layer for protecting the semiconductor chip 71. Further, by providing the encapsulating resin, the mechanical strength of the entire semiconductor package 5 can be improved.

Figure 16:
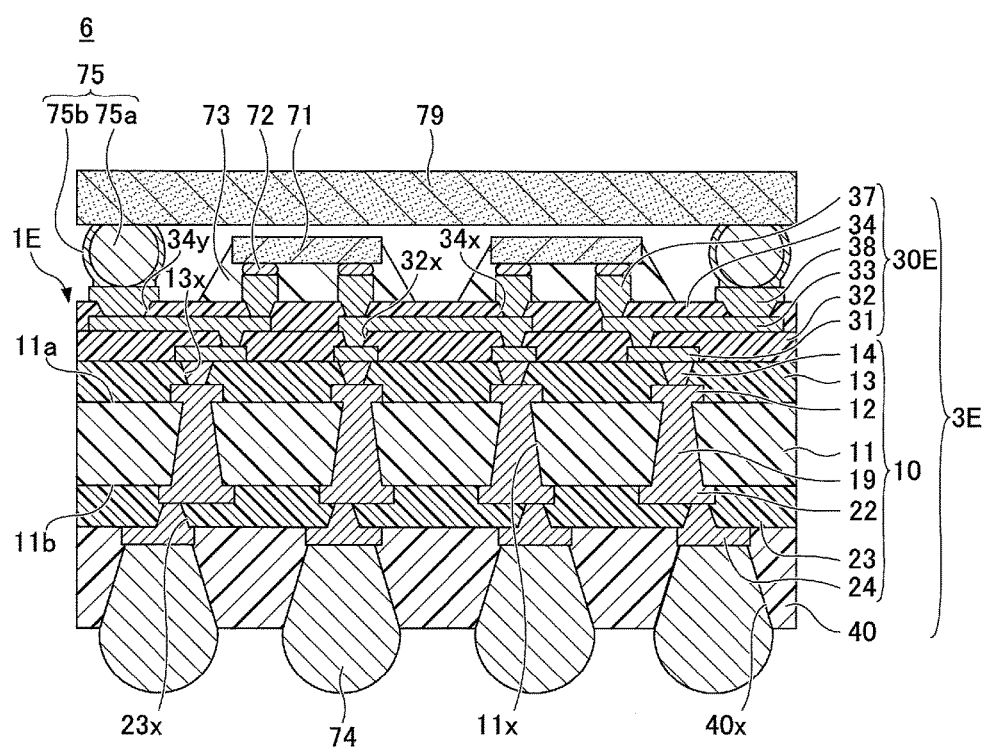

As illustrated in FIG. 16, a semiconductor chip 79 may be mounted on a semiconductor package 6 instead of the semiconductor package 4 (see FIG. 15). Further, the basic structure of the wiring substrate 1D of FIG. 14 or the wiring substrate 1E of FIGS. 15 and 16 may be the structure of the wiring substrate 1A, 1B or 10.

<Simulation>

Figure 17A:
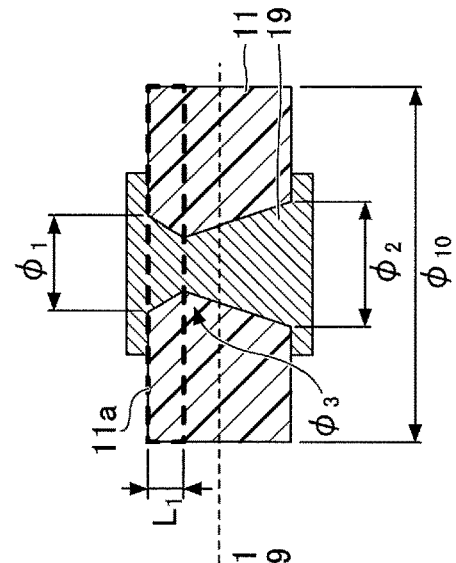
FIGS. 17A-18B are schematic diagrams illustrating a simulation pertaining to a projection amount of a through-wiring according to an embodiment of the present invention.
Figure 17B:
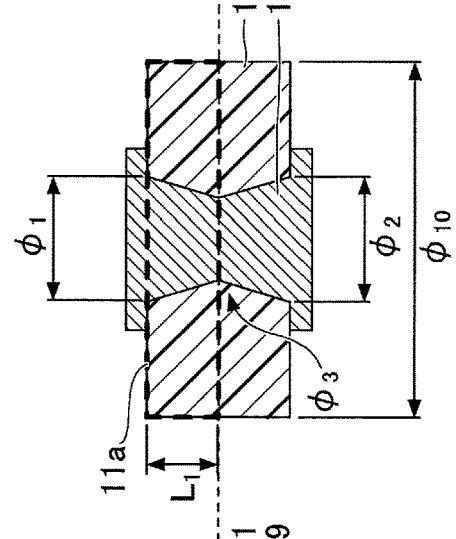
Figure 17C:
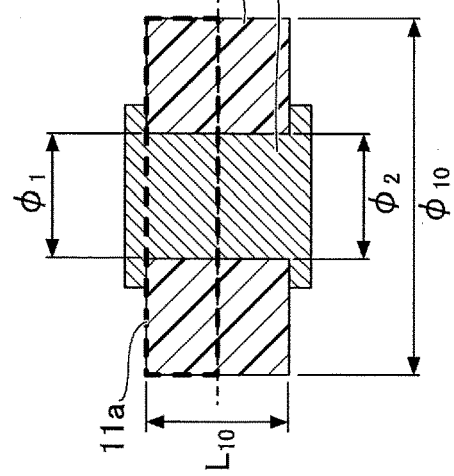

The amount in which the upper end surface of the through-wiring 19 projects from the one surface 11a of the core layer 11 after a heating process was compared among through-wirings 19 of different shapes. More specifically, simulations of projection amounts were performed on through-wirings 19 of three kinds of shapes as illustrated in FIGS. 17A-17C. FIG. 17A illustrates the through-wiring 19 having a straight (circular-cylindrical) shape (comparative example). FIG. 17B illustrates the through-wiring 19 having an hourglass shape in which the constriction part is positioned at the center of the through-wiring in the thickness direction of the core layer 11 (comparative example). FIG. 17C illustrates the through-wiring 19 having an hourglass shape in which the constriction part is positioned closer to the upper end surface of the through-wiring 19 than the center of the through-wiring 19 in the thickness direction of the core layer 11 (practical example).

In FIGS. 17A to 17C, a through-wiring 19 is concentrically formed in a circular column-shaped core layer 11 having a diameter of $\phi_{10}=200$ μm and a height of $L_{10}=200$ μm. In the through-wirings 19 of FIGS. 17A to 17C, the diameter $\phi_1$ of the upper end surface, the diameter $\phi_2$ of the lower end surface, the diameter $\phi_3$ of the constriction part, and the position $L_1$ (distance between the constriction part and the upper end surface) of the constriction part are indicated in Table 1 (the unit of the values in Table 1 is [μm]).

TABLE 1

| | DIAMETER $\phi_1$ OF UPPER END SURFACE | DIAMETER $\phi_2$ OF LOWER END SURFACE | DIAMETER $\phi_3$ OF CONSTRICTION PART | POSITION $L_1$ OF CONSTRICTION PART |
|---|---|---|---|---|
| 17A | 150 | 150 | — | — |
| 17B | 150 | 150 | 130 | 100 |
| 17C | 120 | 150 | 100 | 42.5 |

As preconditions of the simulation, the through-wiring 19 is formed of copper, the thermal expansion coefficient of the through-wiring 19 is 18 ppm/° C., the thermal expansion coefficient of the core layer 11 is 25 ppm/° C., and the maximum temperature of the thermal history is 230° C.

Under these conditions, the difference of expansion in the thickness direction of the core layer 11 and the through-wiring 19 is calculated with respect to the regions indicated with broken lines in FIGS. 17A to 17C. Thereby, the amount in which the upper end surface of the through-wiring 19 projects from the one surface 11a of the core layer 11 is calculated. The results of the calculation are indicated in Table 2 (the unit of the values in Table 2 is [μm]).

TABLE 2

| | PROJECTION AMOUNT |
|---|---|
| 17A | 0.6 |
| 17B | 0.5 |
| 17C | 0 |

As illustrated in Table 2, the projection amount is 0.6 μm in the case where the through-wiring 19 has a straight (circular column shape) shape illustrated in FIG. 17A and the projection amount is 0.5 μm in the case where the through-wiring 19 has an hourglass shape in which the constriction part is positioned at the center of the through-wiring 19 in the thickness direction of the core layer 11 as illustrated in FIG. 17B. Thus, there is little difference between the through-wirings 19 of FIGS. 17A and 17B. On the other hand, the projection amount is 0 μm in the case where the through-wiring 19 has an hourglass shape in which the constriction part is positioned closer to the upper end surface of the through-wiring 19 than the center of the through-wiring 19 in the thickness direction of the core layer 11 as illustrated in FIG. 17C.

That is, by forming the through-wiring 19 into an hourglass shape in which the constriction part is positioned closer to the upper end surface of the through-wiring 19 than the center of the through-wiring 19 in the thickness direction of the core layer 11, the amount in which the upper end surface of the through-wiring 19 projects from the one surface 11a of the core layer 11 can be significantly reduced compared to the through-wiring 19 having a straight shape. Further, the effect of reducing the projection amount is small in a case where the through-wiring 19 is merely formed into an hourglass shape. In order to significantly reduce the amount in which the upper end surface of the through-wiring 19 projects from the one surface 11a of the core layer 11, the constriction part is to be positioned closer to the upper end surface of the through-wiring 19 than the center of the through-wiring 19 in the thickness direction of the core layer 11. When positioning the constriction part closer to the upper end surface of the through-wiring 19 than the center of the through-wiring 19 in the thickness direction of the core layer 11, it is preferable to divide the core layer 11 into four parts in the thickness direction of the core layer 11 and form the constriction part in the part (¼ of the thickness of the core layer 11) that is closest to the upper end surface of the through-wiring 19.

The reason that the projection amount is significantly reduced by providing the constriction part more toward the upper end surface of the through-wiring 19 than the center of the through-wiring 19 in the thickness direction of the core layer 11 is because the volume of copper on the side of the upper end surface of the through-wiring 19 becomes less than the volume of copper in the constriction part. Thus, the side of the upper end surface of the through-wiring 19 is less affected by the difference of the thermal expansion coefficient.

Figure 18A:
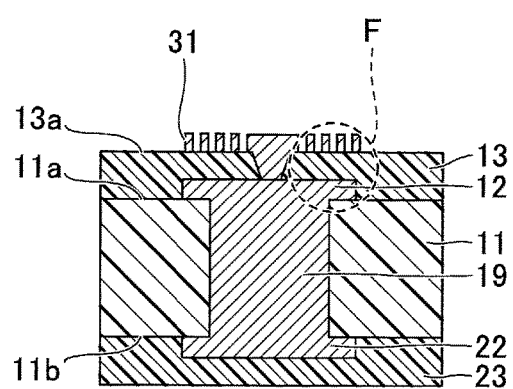
Figure 18B:
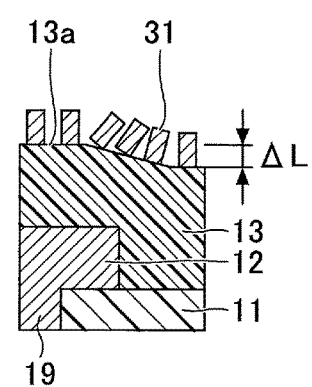

Next, a case where the wiring layer 31 is formed on the core layer 11 by way of the insulating layer 13 is simulated as illustrated in FIG. 18A. In this case, the through-wiring 19 has a straight (circular column shape) shape, the height of the wiring layer 31 is 2 μm, and the line/space of the wiring layer 31 is 2 μm/2 μm. According to the result of the simulation, the thermal history causes the side of the upper end surface of the through-wiring 19 to project 0.6 μm Thereby, irregularities of ΔL=0.6 μm is formed on the upper surface 13a of the insulating layer 13 as illustrated in FIG. 18B. FIG. 18B is an enlarged view of part F of FIG. 18A.

In a case where irregularities of ΔL=0.6μm is formed on the upper surface 13a of the insulating layer 13, it is difficult to actually form the wiring layer 31. Further, the side of the upper end surface of the through-wiring 19 projects 0.6 μm after the wiring layer 31 is formed. Thus, even in the case where the irregularities of ΔL=0.6 μm are formed on the upper surface 13a of the insulating layer 13, problems such as collapsing of the wiring layer 31 may occur. Therefore, it is important to optimize the shape of the through-wiring 19 in order to reduce the amount in which the upper end surface of the through-wiring 19 projects from the one surface 11a of the core layer 11.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, in order to increase rigidity of the wiring substrate, a reinforcement member may be included in the insulating layers (e.g., insulating layers 13, 23) constituting the first wiring member. In this case, the insulating layer may be have an epoxy type resin or a polyimide type resin impregnated in a reinforcement member having a woven or non-woven cloth made of glass fiber, carbon fiber, or an aramid fiber.

In the above-described embodiments, a solder resist layer may further be formed on a semiconductor device mounting surface. For example, a solder resist layer that exposes the wiring layer 37 may be formed on the insulating layer 34 of the wiring substrate 1.

What is claimed is:
1. A wiring substrate comprising:
a core layer having a first surface and a second surface;
a first wiring layer formed on the first surface of the core layer;
a first insulating layer being formed on a side of the first surface of the core layer to cover the first wiring layer and including an upper surface;
a first via wiring being embedded in the first insulating layer and having a first end surface that is exposed from the upper surface of the first insulating layer;
a second wiring layer being formed on the upper surface of the first insulating layer and the first end surface of the first via wiring and being directly bonded to the first end surface of the first via wiring;
a second insulating layer being formed on the upper surface of the first insulating layer to cover the second wiring layer;
a second via wiring being embedded in the second insulating layer and being electrically connected to the second wiring layer;
a third wiring layer formed on the second surface of the core layer;
a third insulating layer being formed on a side of the second surface of the core layer and including a lower surface;
a third via wiring being embedded in the third insulating layer and being electrically connected to the third wiring layer; and
a through-wiring that penetrates the core layer from the first surface to the second surface and electrically connects the first wiring layer and the third wiring layer;
wherein the through-wiring includes upper and lower end surfaces,
wherein the upper end surface has an area that is smaller than an area of the lower end surface,
wherein the upper surface of the first insulating layer has lower roughness than the lower surface of the third insulating layer,
wherein any given wiring layer includes a plurality of wirings, and the second wiring layer has a line width and a line interval that are shorter than a line width and a line interval of the first wiring layer, respectively, the line width indicating a width of each of the wirings, and the line interval indicating an interval between the wirings,
wherein the upper surface of the first insulating layer and the lower surface of the third insulating layer are two opposite surfaces facing away from the core layer in opposite directions and having different roughnesses from each other,
wherein the first wiring layer is thicker than the second wiring layer, and the first insulating layer is thicker than the second insulating layer,
wherein the first insulating layer and the third insulating layer are formed of non-photosensitive resins,
wherein the second insulating layer is formed of a photosensitive resin,
wherein a semiconductor device mounting surface is formed on a side of the second insulating layer, the semiconductor device mounting surface being situated on a same side of the through-wiring as the upper end surface of the through-wiring, which is narrower than the lower end surface of the through-wiring,
wherein an external device mounting surface is formed on a side of the third insulating layer,
wherein the upper surface of the first insulating layer and the first end surface of the first via wiring are polished surfaces,
wherein a thickness of the first insulating layer is less than a thickness of the third insulating layer, wherein the second wiring layer includes an electroplating layer that is layered on a seed layer, and wherein the first end surface of the first via wiring is directly bonded to the seed layer of the second wiring layer.

2. The wiring substrate as claimed in claim 1, wherein the first end surface of the first via wiring is flush with the upper surface of the first insulating layer.

3. The wiring substrate as claimed in claim 1, wherein an area of a horizontal cross section of the through-wiring becomes larger from the upper end surface of the through-wiring to the lower end surface of the through-wiring.

4. The wiring substrate as claimed in claim 1, wherein the through-wiring includes a constriction part that has a horizontal cross section that is smaller than an area of the upper end surface of the through-wiring and an area of the lower end surface of the through-wiring, and wherein the constriction part is positioned toward more closer to the upper end surface than the lower end surface in a thickness direction of the core layer.

5. The wiring substrate as claimed in claim 1, wherein a line width and a line interval of wirings shortens as a distance from the core layer increases with respect to the first wiring layer and the second wiring layer.

6. A semiconductor package comprising:

a semiconductor device; and a wiring substrate on which the semiconductor device is mounted, the wiring substrate including a core layer having a first surface and a second surface, a first wiring layer formed on the first surface of the core layer, a first insulating layer being formed on a side of the first surface of the core layer to cover the first wiring layer and including an upper surface, a first via wiring being embedded in the first insulating layer and having a first end surface that is exposed from the upper surface of the first insulating layer, a second wiring layer being formed on the upper surface of the first insulating layer and the first end surface of the first via wiring and being directly bonded to the first end surface of the first via wiring, a second insulating layer being formed on the upper surface of the first insulating layer to cover the second wiring layer, a second via wiring being embedded in the second insulating layer and being electrically connected to the second wiring layer, a third wiring layer formed on the second surface of the core layer, a third insulating layer being formed on a side of the second surface of the core layer and including a lower surface, a third via wiring being embedded in the third insulating layer and being electrically connected to the third wiring layer, and a through-wiring that penetrates the core layer from the first surface to the second surface and electrically connects the first wiring layer and the third wiring layer;

wherein the through-wiring includes upper and lower end surfaces, wherein the upper end surface has an area that is smaller than an area of the lower end surface, wherein the upper surface of the first insulating layer has lower roughness than the lower surface of the third insulating layer, wherein any given wiring layer includes a plurality of wirings, and the second wiring layer has a line width and a line interval that are shorter than a line width and a line interval of the first wiring layer, respectively, the line width indicating a width of each of the wirings, and the line interval indicating an interval between the wirings, wherein the upper surface of the first insulating layer and the lower surface of the third insulating layer are two opposite surfaces facing away from the core layer in opposite directions and having different roughnesses from each other, wherein the first wiring layer is thicker than the second wiring layer, and the first insulating layer is thicker than the second insulating layer, wherein the first insulating layer and the third insulating layer are formed of non-photosensitive resins, wherein the second insulating layer is formed of a photosensitive resin, wherein a semiconductor device mounting surface is formed on a side of the second insulating layer, the semiconductor device mounting surface being situated on a same side of the through-wiring as the upper end surface of the through-wiring, which is narrower than the lower end surface of the through-wiring, wherein an external device mounting surface is formed on a side of the third insulating layer wherein the upper surface of the first insulating layer and the first end surface of the first via wiring are polished surfaces, wherein a thickness of the first insulating layer is less than a thickness of the third insulating layer, wherein the second wiring layer includes an electroplating layer that is layered on a seed layer, and wherein the first end surface of the first via wiring is directly bonded to the seed layer of the second wiring layer.

7. The semiconductor package as claimed in claim 6, wherein a line width and a line interval of wirings shortens as a distance from the core layer increases with respect to the first wiring layer and the second wiring layer.

* * * * *